(12) United States Patent
Fabry

(10) Patent No.: US 8,085,568 B1
(45) Date of Patent: Dec. 27, 2011

(54) METHODS AND CIRCUITS FOR PLACING UNUSED CONTENT ADDRESSABLE MEMORY (CAM) CELLS INTO LOW CURRENT STATES

(75) Inventor: Martin Fabry, Mountain View, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 609 days.

(21) Appl. No.: 12/215,747

(22) Filed: Jun. 27, 2008

Related U.S. Application Data

(60) Provisional application No. 60/937,797, filed on Jun. 29, 2007.

(51) Int. Cl.
*G11C 15/00* (2006.01)

(52) U.S. Cl. .................................. 365/49.17; 365/49.16

(58) Field of Classification Search .............. 365/49.1, 365/49.11, 49.16, 49.17; 711/108, 109, 110
See application file for complete search history.

(56) References Cited

U.S. PATENT DOCUMENTS

| | | | |
|---|---|---|---|
| 5,491,703 A | 2/1996 | Barnaby et al. | |
| 6,324,087 B1 | 11/2001 | Pereira | |
| 6,542,391 B2 | 4/2003 | Pereira et al. | |
| 6,657,878 B2 * | 12/2003 | Lien et al. ..................... | 365/49.1 |
| 6,795,325 B1 | 9/2004 | Inoue | |
| 6,804,134 B1 | 10/2004 | Proebsting et al. | |
| 6,831,850 B2 | 12/2004 | Pereira et al. | |
| 6,845,025 B1 * | 1/2005 | Nataraj ........................ | 365/49.1 |
| 6,967,855 B2 | 11/2005 | Srinivasan et al. | |
| 6,993,622 B2 | 1/2006 | Khanna et al. | |
| 7,133,302 B1 | 11/2006 | Srinivasan et al. | |
| 7,417,881 B2 | 8/2008 | Srinivasan et al. | |
| 7,782,645 B1 | 8/2010 | Gaddam et al. | |
| 2003/0123269 A1 * | 7/2003 | Gillingham et al. ............ | 365/49 |
| 2005/0207212 A1 * | 9/2005 | Tsujimura et al. ............ | 365/154 |
| 2006/0171184 A1 * | 8/2006 | Khurana et al. ................ | 365/49 |
| 2007/0247885 A1 * | 10/2007 | Watanabe et al. ............... | 365/49 |
| 2008/0031033 A1 * | 2/2008 | Chai et al. ..................... | 365/149 |
| 2008/0189484 A1 * | 8/2008 | Iida et al. ...................... | 711/114 |
| 2008/0259667 A1 * | 10/2008 | Wickeraad ................... | 365/49.1 |

OTHER PUBLICATIONS

Notice of Unpublished Applications referencing U.S. Appl. No. 12/215,875 and U.S. Appl. No. 12/431,332.

* cited by examiner

*Primary Examiner* — Ang Phung
*Assistant Examiner* — Douglas King
(74) *Attorney, Agent, or Firm* — Haverstock & Owens, LLP

(57) ABSTRACT

A method of placing a content addressable memory (CAM) into a low current state is disclosed. The CAM can include at least one storage location that does not store valid data for a compare operation and includes a plurality of CAM cells, each CAM cell having at least two data controllable impedance paths arranged in parallel with one another. The method can include configuring the majority of the CAM cells to store data values that maintain the corresponding at least two data controllable impedance paths in high impedance states.

30 Claims, 12 Drawing Sheets

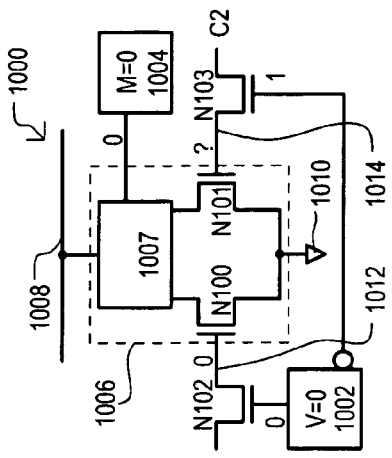
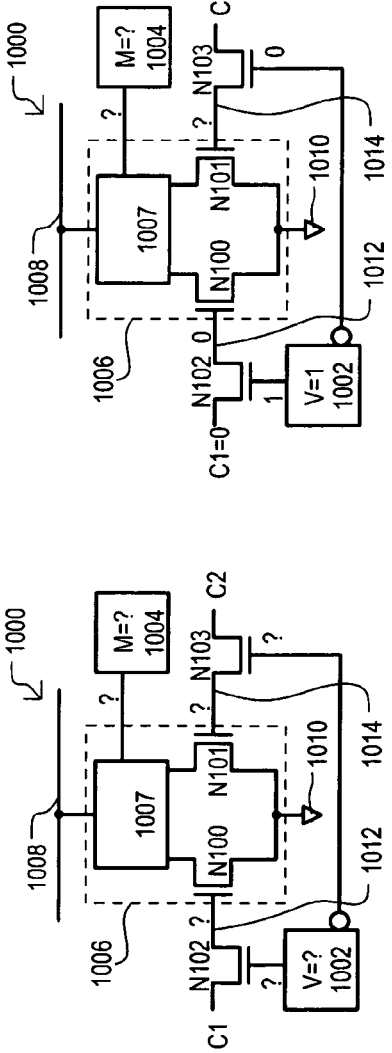
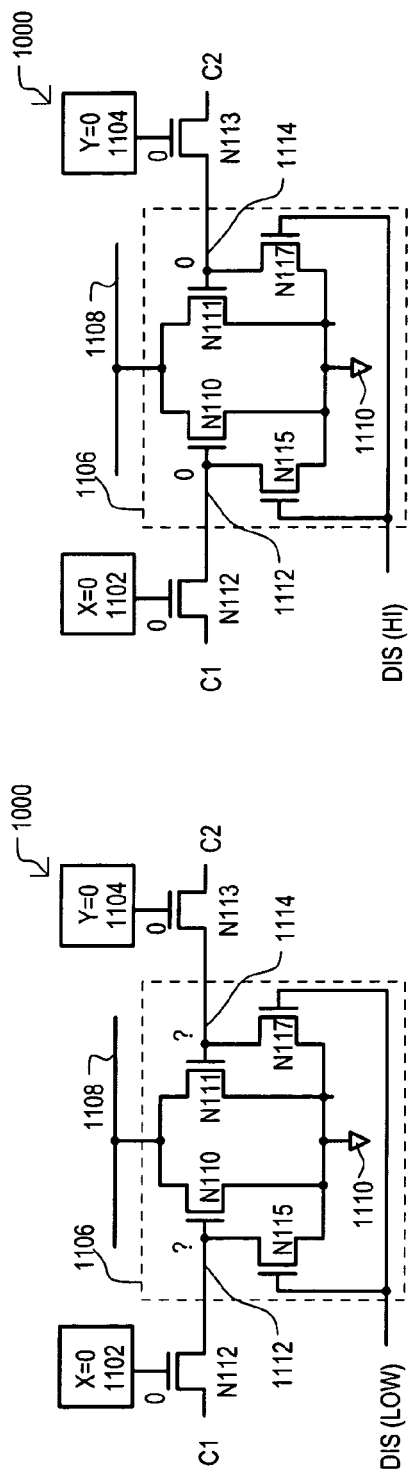

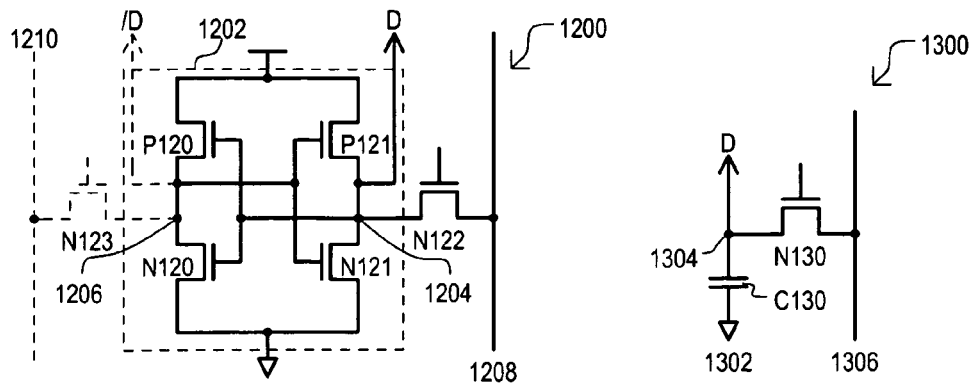
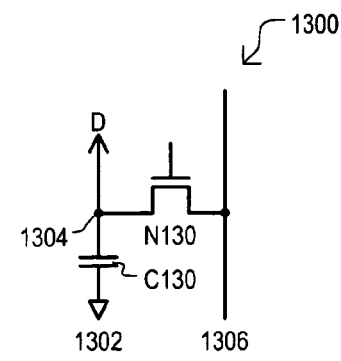
FIG. 12    FIG. 13
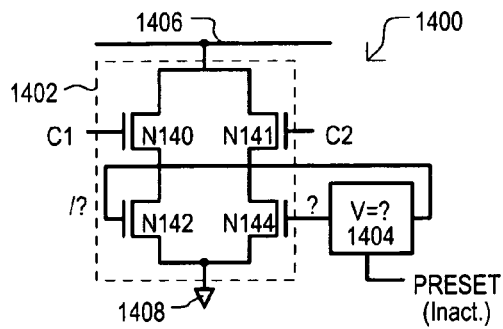
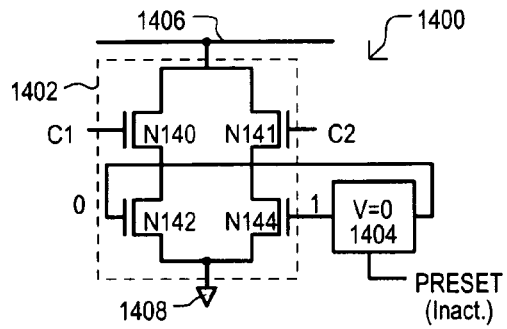
FIG. 14A    FIG. 14B
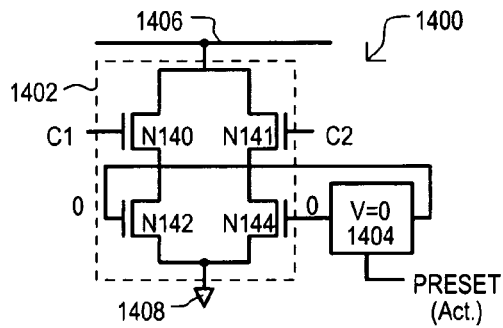
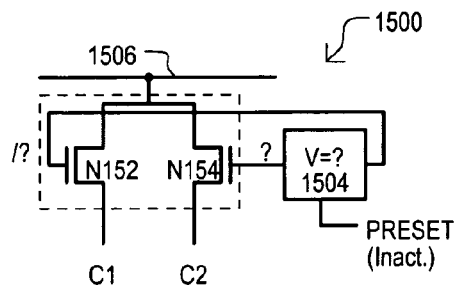
FIG. 14C    FIG. 15A
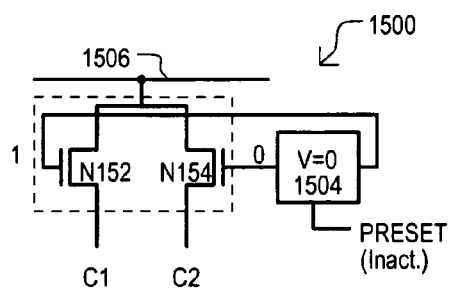
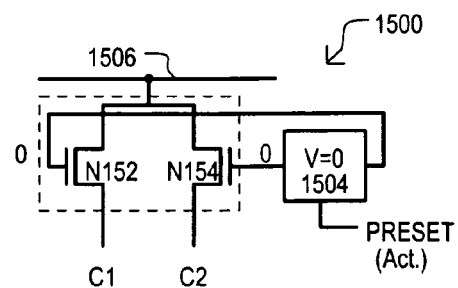
FIG. 15B    FIG. 15C FIG. 20
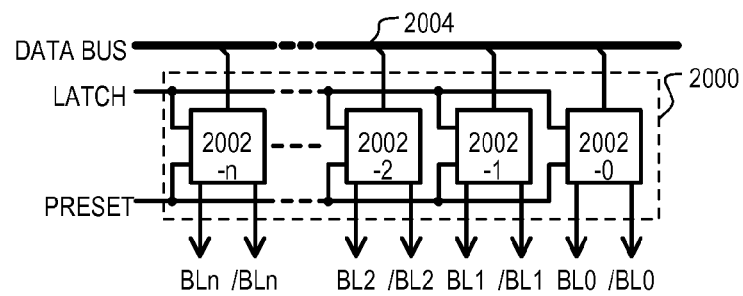
FIG. 21
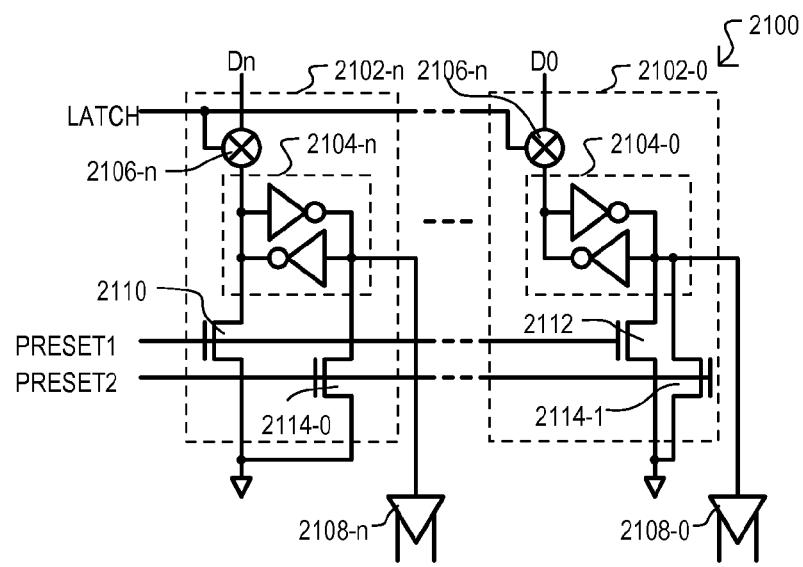
FIG. 22A
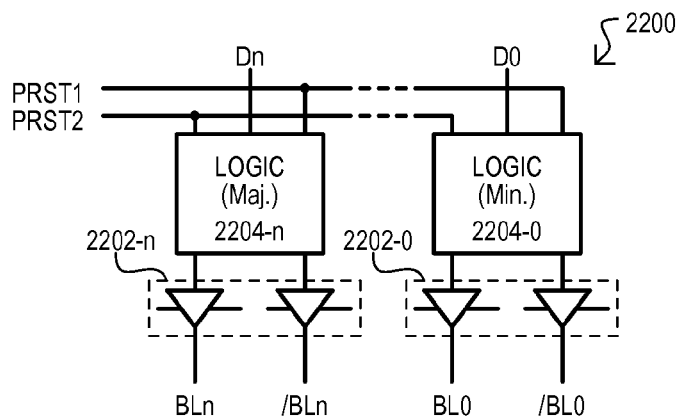
FIG. 22B
| Dn,0 | PRST1 | PRST2 | BLn | BL0 |
|---|---|---|---|---|
| 0 | 0 | 0 | 0 | 0 |
| 1 | 0 | 0 | 1 | 1 |
| X | 1 | X | 0 | 1 |
| X | 0 | 1 | 1 | 1 |

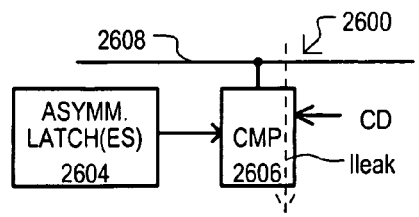
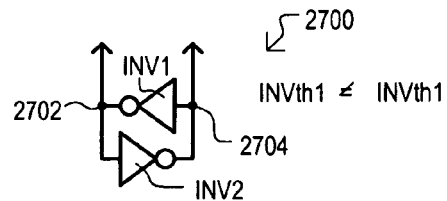
FIG. 26   FIG. 27
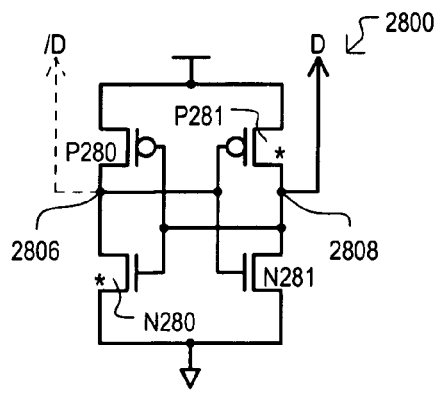
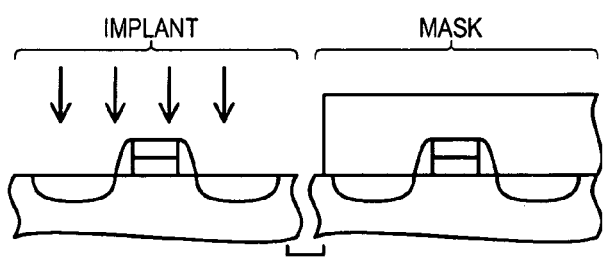
FIG. 28A   FIG. 28B
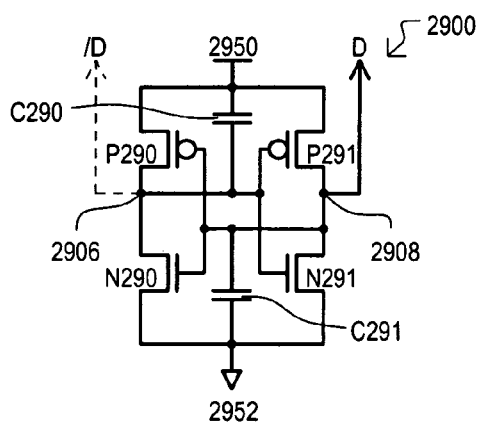
FIG. 29

US 8,085,568 B1

METHODS AND CIRCUITS FOR PLACING UNUSED CONTENT ADDRESSABLE MEMORY (CAM) CELLS INTO LOW CURRENT STATES

This application claims the benefit of U.S. Provisional Patent Application Ser. No. 60/937,797, filed on Jun. 29, 2007, the contents of which are incorporated by reference herein.

TECHNICAL FIELD

The present invention relates generally to content addressable memory (CAM) devices, and more particularly to placing a CAM device having a number of entries, each of which can store valid or invalid data.

BACKGROUND OF THE INVENTION

Content addressable memory (CAM) devices, sometimes referred to as "associative memories," can receive a compare data value (sometimes referred to as a comparand or search key), and compare such a value against a number of stored data values. In most configurations, such an operation can match a compare data value against a very larger number of stored data values (e.g., thousands or millions), essentially simultaneously.

Such rapid compare functions have resulted in CAM devices enjoying wide application in various packet processing hardware devices, such as routers and network switches, to name just two. In a typical packet processing operation, a device can receive a packet. The packet can include a "header" that includes various data fields that indicate how the packet should be processed. The hardware device can use a matching function, provided by a CAM, to compare one or more header fields to stored data values that can indicate how the packet is to be processed.

Many CAM device configurations can include a number of CAM memory cells arranged in a logical fashion (e.g., rows, words, etc.) to store data values for comparison with a search key. Such CAM memory cells typically include a storage circuit for storing one or more bit values as well as a compare circuit, for comparing the stored data value(s) with corresponding portions of a received search key.

CAM devices are typically manufactured in integrated circuit form, as stand alone memory devices, or as some portion of an integrated circuit providing other functions. For many integrated circuit applications, including those that include CAM memory cells, current draw can be an important feature. That is, it is desirable to reduce current draw in an integrated circuit to as great an extent as possible.

To better understand various aspects of the present invention, a conventional CAM device circuit will briefly be described.

FIG. 30 shows an example of an "XY" ternary CAM (TCAM) device 3000 that includes three XY TCAM cells 3002-0 to 3002-2 arranged in parallel with one another between a match line 3004 and a discharge node 3006. Each XY CAM cell (3002-0 to 3002-2) can include two storage circuits (shown by example as 3008-0, 3008-1) and a compare circuit (shown by example as 3010). XY CAM cells (3002-0 to 3002-1) can be configured to execute particular match operations according to values stored and provided by their corresponding storage circuits (e.g., 3008-0 and 3008-1). For example, a configuration X=0, Y=1 can result in a match when an applied compare bit value CD=1, while the opposite configuration (X=0, Y=1) can result in a match when an applied compare bit value CD=0. If both X and Y values are zero, the CAM cell can be in a masked state, and thus match regardless of the compare data value (CD=1 or 0). If both X and Y values are one, the CAM cell can be in an "empty" state, and thus mis-match regardless of the compare data value (CD=1 or 0).

Referring still to FIG. 30, compare operations for the TCAM device 3000 can rely on precharging match line 3004 to a relatively high potential, to create a difference in voltage between the match line 3004 and discharge node 3006. If a bit compare operation for all TCAM cells indicates a match (or mask), the compare circuits (e.g., 3010) can maintain a high impedance, and match line 3004 can remain at a precharge level. However, if any TCAM cell indicates a mis-match, a corresponding compare circuit (e.g., 3010) will create a low impedance path between match line 3004 and discharge node 3006, resulting in the match 3006 line being discharged to a potential lower than the precharge potential.

In the particular example of FIG. 30, each compare circuit (e.g., 3010) can include four n-channel insulated gate field effect transistors N300-N303, with transistors N300 and N302 having source-drain paths in series between match line 3004 and discharge node 3006, while transistors N1 and N3 have source-drain paths in series between match line 3004 and discharge node 3006. Thus, transistors N300/N302 can form one discharge path, while transistors N301/N303 can form another discharge path.

Transistor N300 can receive a first compare data value CD at its gate. Transistor N301 can receive a second compare data value /CD at its gate. Transistor N302 can receive value X at its gate. Transistor N303 can receive value Y at its gate.

In a match operation, each of compare data values CD and /CD can be driven to complementary values, to thereby enable a compare operation within a corresponding compare circuit (e.g., 3010). However, before a match operation, compare data value CD, /CD can all be driven low. This can result in compare circuits (e.g., 3010) of all the TCAM cells (e.g., 3010) having a high enough impedance between match line 3004 and discharge node 3006 to enable match line 3004 to be precharged.

Unfortunately, even with logic low values applied to both transistors N300 and N301, such transistors may still be subject to leakage current, such as subthreshold leakage currents. This may be particularly true at smaller geometry (achievable gate length) transistor sizes, and/or lower power supply voltages. In the event a corresponding transistor of the same discharge path receives a high logic value at its to gate, leakage can be worse.

Referring to FIG. 30, TCAM cell 3002-0 is configured into the empty state, with values X=Y=1. While such a state is desirable in some applications, as it can force a mis-match for the storage location, such a state also enables leakage paths Ileak1 and Ileak2 down both discharge paths N300/N302 and N301/N303. TCAM cell 3002-1 shows an arrangement in which only one stored data value is a logic high. This can still create an undesirable current path down one discharge path in the cell (in the case X=1, resulting in current Ileak3 through discharge path N300/N302). TCAM cell 3002-2 shows a lowest leakage configuration, with the TCAM cell 3002-2 with values X=Y=0.

In some applications, XY TCAM devices can have all entries programmed to an empty state prior to having data values stored within. As a result, when such a TCAM device is sparsely populated (i.e., most entries remain unused), considerable leakage current can be drawn by the large number of empty TCAM cells. In addition, in many conventional XY TCAMs, storage circuits (e.g., 3008-0 and 3008-1) can initialize (e.g., power-up) into unknown or random states. Thus, upon initialization, a TCAM can have many leakage paths through cells like those described above.

Many conventional CAM devices distinguish between "valid" entries and "invalid" entries. Valid entries can store a data value for use in a compare operation. That is, when data of a valid entry indicates a match with a comparand value, a valid match result can be generated. Invalid entries include data that should be excluded from search operations. That is, data of an invalid entry should not indicate a match, regardless of an applied comparand value. Typically, an entry can include one (or a very limited number of) bit location(s) designated as valid bits. Valid bit(s) can be set to a value (e.g., logic "1" or logic "0") to designate an entry as valid or invalid. In a search operation, a search key can include a corresponding search valid bit(s) for comparison with that of the entry. Valid bits of an invalid entry will not match the search valid bits, and thus force a mis-match for the entry.

BRIEF DESCRIPTION OF THE DRAWINGS

FIGS. 10A to 10C are block schematic diagrams showing a preset operation for a third type VM CAM cell according to an embodiment.

FIGS. 11A and 11B are block schematic diagrams showing one example of a CAM cell having built-in preset capabilities, according to one embodiment.

FIG. 12 is a schematic diagram of a static storage circuit that can be included in embodiments of the invention.

FIG. 13 is a schematic diagram of a dynamic storage circuit that can be included in embodiments of the invention.

FIGS. 14A to 14C are block schematic diagrams of a binary CAM cell preset operation that includes a specialized storage circuit according to an embodiment.

FIGS. 15A to 15C are block schematic diagrams of another binary CAM cell preset operation that includes a specialized storage circuit according to an embodiment.

FIG. 20 is a block schematic diagram of a specialized write register that can be included in embodiments of the invention.

FIG. 21 shows bit registers according to one embodiment.

FIGS. 22A and 22B show a block schematic diagram and a truth table describing specialized bit line driver circuits that can be included in embodiments of the invention.

FIG. 26 is a block schematic diagram of a CAM cell having inherent preset state capabilities that can be included in the embodiments.

FIG. 27 is a block schematic diagram of an asymmetric latch that can be included in storage circuits of CAM cells according to an embodiment.

FIG. 28A is a schematic diagram illustrating an asymmetric latch that can be included in storage circuits of CAM cells according to an embodiment. FIG. 28B is side cross sectional view showing one way of varying threshold voltages of transistors to form an asymmetric latch.

FIG. 29 is a schematic diagram of another asymmetric latch that can be included in storage circuits of CAM cells according to an embodiment.

DETAILED DESCRIPTION

Various embodiments of the present invention will now be described in detail with reference to a number of drawings. The embodiments include a content addressable memory (CAM) device, CAM circuits, systems and methods for configuring a CAM device.

Figure 1A:
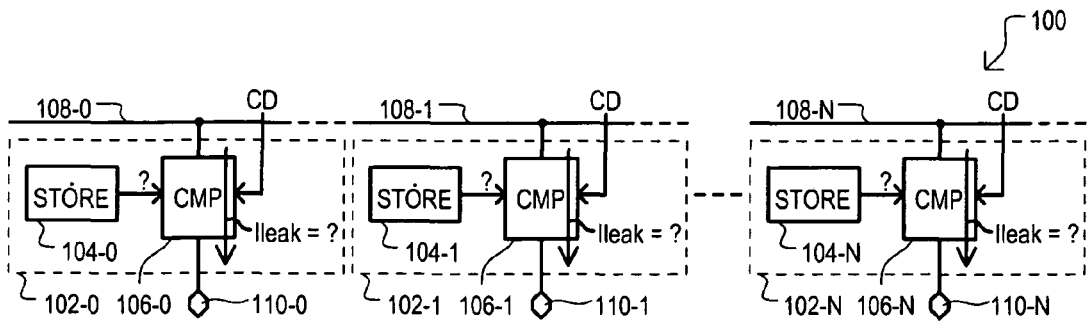
FIGS. 1A and 1B are block schematic diagrams showing a content addressable memory (CAM) device according to a first embodiment of the present invention.
Figure 1B:
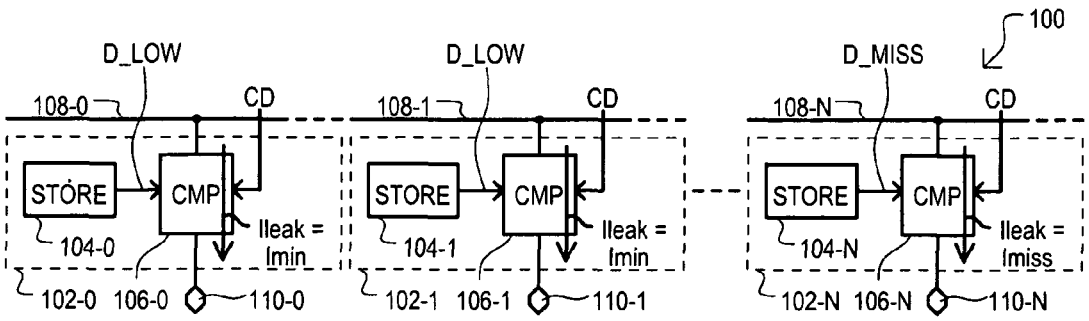

Referring now to FIGS. 1A and 1B, a CAM device and operation according to a first embodiment of the present invention is set forth in a series of block diagrams and designated by the general reference character 100. A CAM device 100 can include a number of CAM cells 102-0 to 102-N that can form all or part of a CAM entry. Each CAM cell (102-0 to 102-N) can include a storage circuit 104-0 to 104-N and a compare circuit 106-0 to 106-N.

Each storage circuit (104-0 to 104-N) can store one or more data values that are applied to the corresponding compare circuit (106-0 to 106-N). For example, in the case of a ternary CAM cell, a storage circuit (104-0 to 104-N) can store at least two bit values, and in a binary CAM cell, a storage circuit (104-0 to 104-N) can store one bit value. It is understood that in the example of FIGS. 1A and 1B, CAM cells (102-0 to 102-N) form part of an entry storing an invalid data value.

That is data values stored by storage circuits (104-0 to 104-N) will no longer be used in any compare operation.

Each compare circuit (106-0 to 106-N) can be arranged between a match node (108-0 to 108-N) and reference node (110-0 to 110-N). In a compare operation, a compare circuit (106-0 to 106-N) can form a high or low impedance path between its respective match node (108-0 to 108-N) and reference node (110-0 to 110-N) to thereby indicate a match or mis-match with a compare data value (CD0 to CDN). In a non-compare operation, each compare circuit (106-0 to 106-N) can also have a leakage current Ileak. The value of a leakage current (Ileak) can vary according to the data value stored by each CAM cell. In that respect, when a storage circuit (104-0 to 104-N) stores particular data, such a data value can be selected for minimizing current through each compare circuit (106-0 to 106-N).

FIG. 1A shows a CAM device 100 prior to a preset operation. FIG. 1B shows the CAM device 100 after a preset operation.

Referring to FIG. 1A, prior to a preset operation, values stored by storage circuits (104-0 to 104-N) can vary, or otherwise be non-determinative. For example, as power is applied to a CAM device 100, data values within storage circuits is (104-0 to 104-N) can vary in an essentially random manner. As another example, storage circuits (104-0 to 104-N) may be part of an entry that previously stored valid data for inclusion in a search operation, but the entry has since been invalidated. As yet another example, storage circuits (104-0 to 104-N) may be part of an "empty" entry that has yet to receive valid data. In cases like and similar to those above, a leakage current through a compare circuit can vary, as data values stored within storage circuits (104-0 to 104-N) cannot be guaranteed to store data values optimized to reduce leakage.

Referring now to FIG. 1B, a preset operation can cause storage circuits (104-0 to 104-N) output predetermined data values for reducing leakage current through compare circuits (106-0 to 106-N−1). More particularly, the majority of storage circuits (104-0 to 104-N−1) can output configuration data D_LOW that represents a data value optimized for drawing a low leakage current (Imin) as compared to all possible data values. Even more particularly, all but one of the storage circuits (104-0 to 104-N−1) can be configured to output such a data value D_LOW.

Referring still to FIG. 1B, for some CAM cell configurations an optimal data value for reducing leakage current can present a masked data condition. Consequently, in order to ensure that an entry can still generate a mis-match condition (and hence remain an invalid entry), a limited number of CAM cells of the entry can be configured to store a data value capable of indicating a mis-match condition. Preferably, two or fewer CAM cells can be configured in such a fashion. In the particular example of FIG. 1B, CAM cell 102-N is shown to be configured in such a fashion, with storage circuit 104-N outputting a data value D_MISS, which can enable a CAM cell 102-N to generate a mis-match indication. At the same time, data value D_MISS is not an optimal value with respect to leakage, consequently, in a non-search operation, compare circuit 106-N can draw a current Imiss, which can be greater than a current Imin drawn by compare circuits in all (or a majority) of the other CAM cells.

Low leakage data values corresponding to a masked data state can arise in XOR/OR type CAM cell architectures. Referring back to FIGS. 1A and 1B, in an XOR/OR type CAM cell architecture, match nodes (108-0 to 108-N) can be commonly connected to a match line and reference nodes (110-0 to 110-N) can be commonly connected to a discharge (or charge) node. In the event of a match indication with all of compare data values (CD0 to CDN), all compare circuits can provide a high impedance and the match line can remain charged (or discharged). In the event of a mis-match with any of compare data values (CD0 to CDN), a corresponding compare circuit can provide a low impedance and the match line can discharge (or charge). Thus, in an XOR/OR architecture, at least one of the CAM cells can be configured to provide a low impedance in a compare operation to ensure a miss-match indication.

A different arrangement can exist for a NAND/AND type CAM architecture. In an AND/NAND type CAM device, match/reference nodes of adjacent cells can be connected together to arrange compare circuits in a series with one another. In the event of a match indication with all of compare data values (CD0 to CDN), all compare circuits can provide a low impedance and the match line can remain charged (or discharged). In the event of a mis-match with any of compare data values (CD0 to CDN), a compare circuit can provide a high impedance and signal path through the CAM cells can be prevented. Thus, in a NAND/AND architecture, at least one of the CAM cells can be configured to provide a high impedance in a compare operation to generate a miss-match indication.

In this way, storage circuits in CAM cells of an invalid entry can be arranged to output data values optimized to reduce current through compare circuits of such CAM cells.

Figure 2:
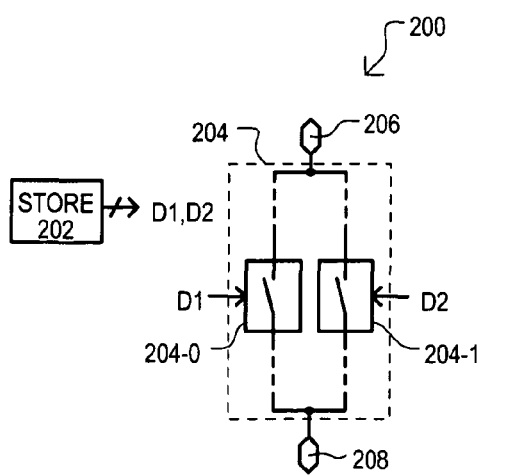
FIG. 2 is a block diagram showing a CAM cell configured according to an embodiment of the present invention.

Referring now to FIG. 2, a first example of a CAM cell having data values configured to a low leakage state is shown in a block schematic diagram and designated by the general reference character 200. A CAM cell 200 can include a storage circuit 202 and a compare circuit portion 204. A storage circuit 202 can output multiple data signals for controlling the impedance of sections within compare circuit portion 204. In the particular example of FIG. 2, data signals include signals D1 and D2. In one very particular arrangement, signals D1, D2 could be X,Y (values of an XY type CAM cell), VM (values of a VM type CAM cell), or in a specialized case (described by example below), data value V stored by a binary type CAM cell.

A compare circuit portion 204 can be situated between a match node 206 and a reference node 208. A match node 208 can provide a match indication for use by other circuits. A compare circuit portion 204 can include an impedance path corresponding to data signals provided by storage circuit 202. In the particular example of FIG. 2, compare circuit portion 204 can include a first switch path 204-0 and a second switch path 204-1 arranged in parallel with one another with respect to a match node 206. An impedance of a first switch path 204-0 can be controlled according to signal D1, while an impedance of a second switch path 204-1 can be controlled according to a signal D2. It is understood that a compare circuit portion can include various other circuit elements situated between switch paths (204-0 and 204-1) and match node 206 and/or between switch paths (204-0 and 204-1) and a reference node 208.

A storage circuit 202 can output values D1,D2 that place first switch path and second switch path (204-0 and 204-1) into high impedance states. In very particular embodiments, switch paths can include transistors, preferably insulated gate field effect transistors (IGFETs), and even more preferably n-channel IGFETs.

While FIG. 2 shows one particular configuration in which switch paths are arranged in parallel with one another between a match node and a reference node, other CAM cell configurations that include a single switch path between a match node and reference node. An arrangement like this is shown in FIG. 3.

Figure 3:
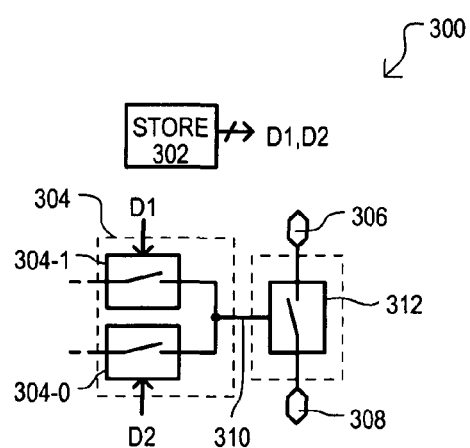
FIG. 3 is a block diagram showing another CAM cell configured according to an embodiment of the present invention.

Referring now to FIG. 3, a second example of a CAM cell having data values configured to a low leakage state is shown in a block schematic diagram and designated by the general reference character 300. A CAM cell 300 can include some of the same general sections as FIG. 2, thus like sections are referred to by the same reference character but with the first digit being a "3" instead of a "2".

A CAM cell 300 can differ from that of FIG. 2 in that a compare circuit portion 304 can include switch paths 304-0 and 304-1 arranged in parallel with one another with respect to a control node 310. A control node 310 can control a match switch path 312 arranged between match node 306 and reference node 308. In such an arrangement, a control node 310 can first be set to potential that places match switch path 312 into a high impedance state. Subsequently, a storage circuit 302 can be set to output values in the same manner as FIG. 2 (i.e., values that place both switch nodes 304-0 and 304-1 into high impedance states).

In this way, storage circuits in CAM cells of an invalid entry can include switch paths controlled according to data values provided by storage circuits. Such data values can place such switch paths into high impedance states.

Figure 4A:
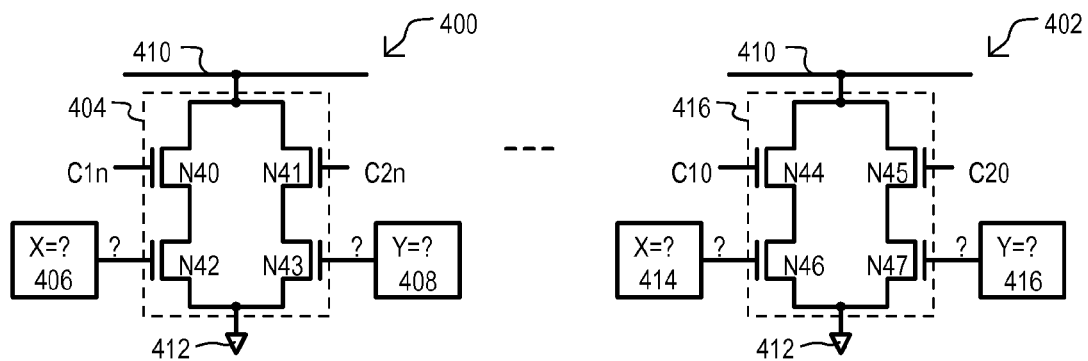
FIGS. 4A and 4B are block schematic diagrams showing a first XY type CAM device entry preset to a low current state according to an embodiment.
Figure 4B:
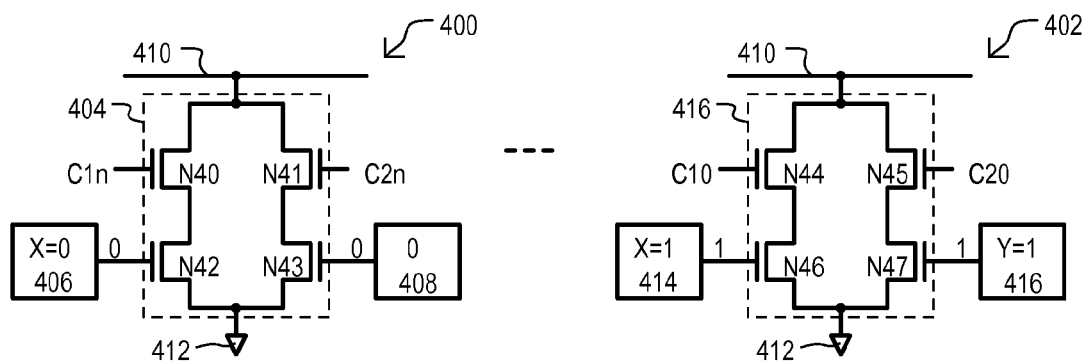

Referring now to FIGS. 4A and 4B, CAM operations according to a third embodiment are shown in a series of schematic diagrams. FIGS. 4A and 4B show two CAM cells 400 and 402. Each CAM cell (400 and 402) can be an XY type CAM cell. Thus, CAM cell 400 includes a compare circuit 404, a first storage circuit (X store) 406, and a second storage circuit (Y store) 408. A compare circuit 404 can include transistors N40 and N42 having source-drain paths arranged in series between a match line 410 and a reference node 412, and transistors N41 and N43 having source-drain paths arranged in series between a match line 410 and a reference node 412. In the very particular example of FIGS. 4A and 4B, transistors N40 to N43 can be n-channel IGFETs.

Transistor N40 can receive a first compare value C1$n$ at its gate, while transistor N41 can receive a second compare value C2$n$ at its gate. Compare values C1$n$/C2$n$ can vary according to operation. For example, in a compare operation such values can be complementary values for a bit of a comparand, and in a non-compare operation can both be driven to a potential that places their respective transistors (N40/N41) into a high impedance state (e.g., C1$n$=C2$n$=logic "0").

X store 406 can output a value to a gate of transistor N42, while Y store 408 can output a value to a gate of transistor N43.

CAM cell 402 is understood to have the same general configuration as CAM cell 400.

CAM cell 400 can represent a majority of CAM cells in an entry that does not store valid data. CAM cell 402 can represent a minority (preferably but one or two) of the CAM cells for the same entry.

FIG. 4A shows states of CAM cells 400 and 402 prior to a preset operation. X stores (406/414) and Y stores (408/416) can store values that are indeterminate, or otherwise not guaranteed to store data values optimal for low current leakage. Accordingly, values stored and output are shown by "?". In the very particular example of FIG. 4A, if any of the values output from X stores (406/414) and Y stores (408/416) is a logic high, a CAM cell will not store low current leakage values. It is understood that in a CAM device with millions of cells, there can be a considerable number of unused cells, and such cells have a high probability of one or both stored values (X and/or Y) being a logic high.

FIG. 4B shows states of CAM cells (400 and 402) in response to a preset operation. A majority of CAM cells, represented by CAM cell 400 can now store values that place both transistors N42 and N43 into a high impedance state. In the very particular example of FIG. 4B, X store 406 and Y store 408 both store and output a logic "0".

In contrast, a small minority of CAM cells, represented by CAM cell 402 can store values that can ensure a mis-match indication. Thus, either or both of X store 414 and Y store 416 can output a value that creates a low impedance state. In the very particular example of FIG. 4B, X store 414 and Y store 416 both store and output a logic "1".

Figure 5A:
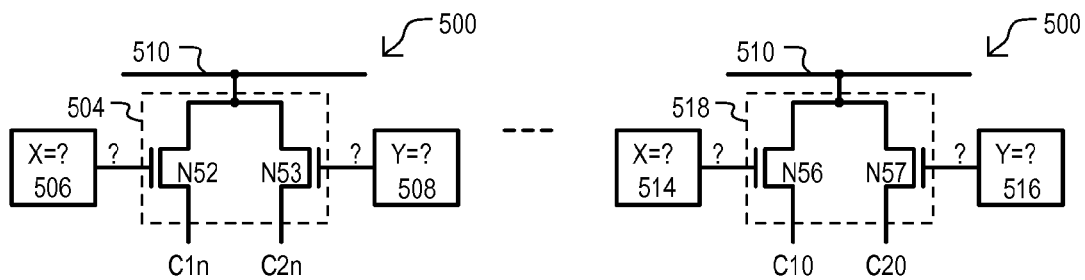
FIGS. 5A and 5B are block schematic diagrams showing a second XY type CAM device entry preset to a low current state according to an embodiment.
Figure 5B:
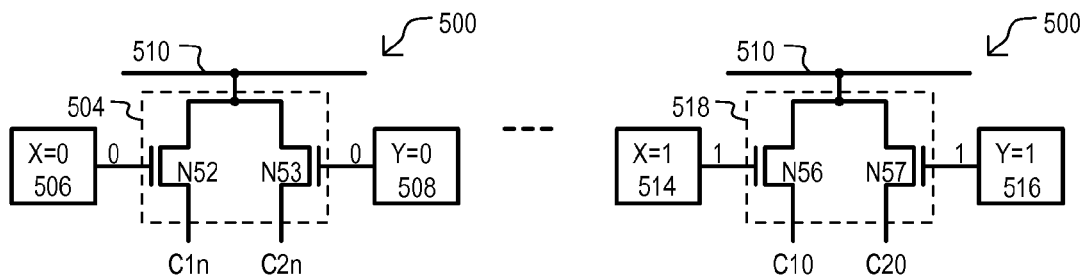

Referring now to FIGS. 5A and 5B, a CAM cell operations according to a fourth embodiment is shown in a series of schematic diagrams. FIGS. 5A and 5B show two XY type CAM cells 500 and 502. The arrangement of FIGS. 5A and 5B can include some of the same general sections and signals as FIGS. 4A and 4B. Thus, like sections are referred to by the same reference character but with the first digit being a "5" instead of a "4".

FIGS. 5A and 5B can differ from that of FIGS. 4A and 4B in that XY CAM cells (500 and 502) can include a compare circuit (504/518) having two transistors (N52/53, N56/N57) that receive compare data values (C1$n$/C2, C10, C20) at their drains.

Otherwise, operations can occur in the same general fashion as FIGS. 4A and 5B. Prior to a preset operation, CAM cells (e.g., 500 and 502) can store values not guaranteed to be optimized for low current. After a preset operation, a majority of such CAM cells (represented by CAM cell 500) can store low current data values (e.g., X=Y=0). At the same time, a small minority of the CAM cells (represented by CAM cell 502) can be placed into a state to ensure a mis-match indication can still be generated.

In this way, most XY CAM cells of a ternary CAM entry can store data values optimized to reduce current leakage, while one, or a small number of CAM cells can store a data value that enables a mis-match indication to be generated for the entry.

Figure 6A:
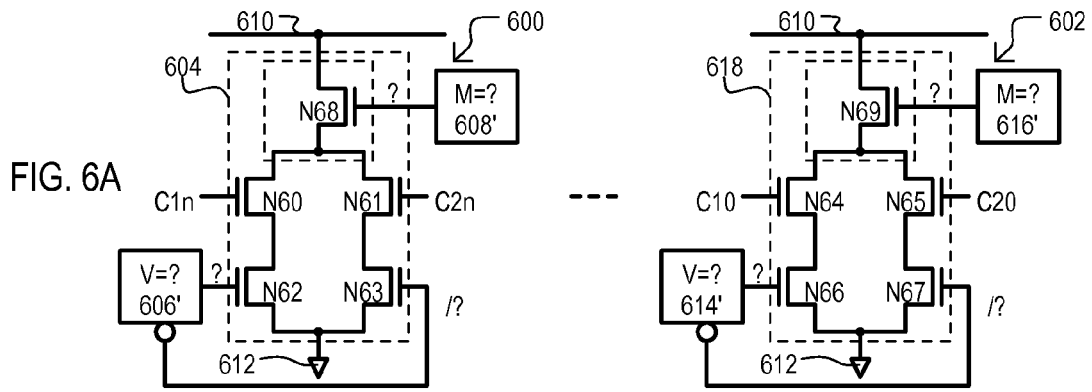
FIGS. 6A and 6B are block schematic diagrams showing a value (V) mask (M) type CAM entry preset to a low current state according to an embodiment.
Figure 6B:
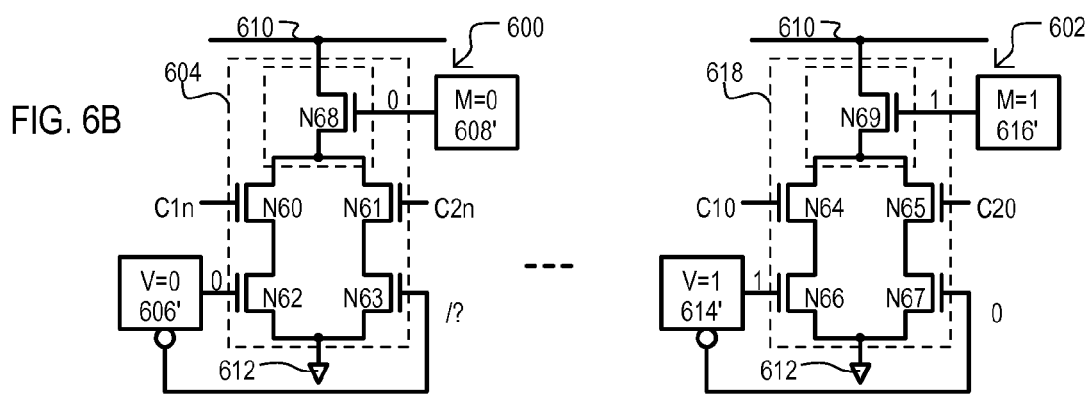

Referring now to FIGS. 6A and 6B, a CAM operations according to a fifth embodiment are shown in a series of schematic diagrams. FIGS. 6A and 6B show two CAM cells 600 and 602. The arrangement of FIGS. 6A and 6B can include some of the same general sections and signals as FIGS. 4A and 4B. Thus, like sections are referred to by the same reference character but with the first digit being a "6" instead of a "4".

FIGS. 6A and 6B can differ from that of FIGS. 4A and 4B in that CAM cells (600 and 602) can be value (V) mask (M) type CAM cells. Thus, a first storage circuit (V store) 606'/614' can store a value V, and output complementary forms of the value V and /V. A second storage circuit (M store) 608'/616' can store a mask value.

Compare circuits 604/618 for CAM cells (600/602) can also be different. As shown by CAM cell 600 (and repeated in CAM cell 602), a data value stored in V store 606 can be output to a gate of transistor N62, and the complement of such a stored value can be output to a gate of transistor N63. Further, a transistor N68 can be included having a source-drain path in series with match node 610 and drains of transistors N60 and N61. M store 608' can provide a data value to a gate of transistor N63.

Operations can occur in a similar general fashion as FIGS. 4A and 4B. Prior to a preset operation, CAM cells (e.g., 600 and 602) can store values not guaranteed to be optimized for low current. After a preset operation, a majority of CAM cells (represented by CAM cell 600) can store data value configured for low current consumption. In the particular case of FIG. 6B, this can include V=M=0. At the same time, a small minority of CAM cells (represented by CAM cell 602) can be placed into a state to ensure a mis-match indication can still be generated. In the particular example shown, this includes V=M=1. However, alternate arrangements could vary the value of V for such minority cells.

Figure 7A:
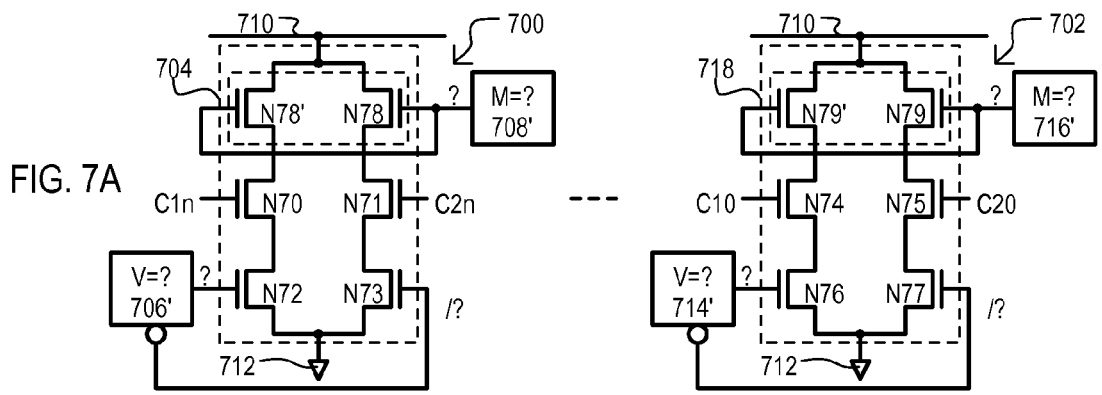
FIGS. 7A and 7B are block schematic diagrams showing another VM type CAM entry preset to a low current state according to an embodiment.
Figure 7B:
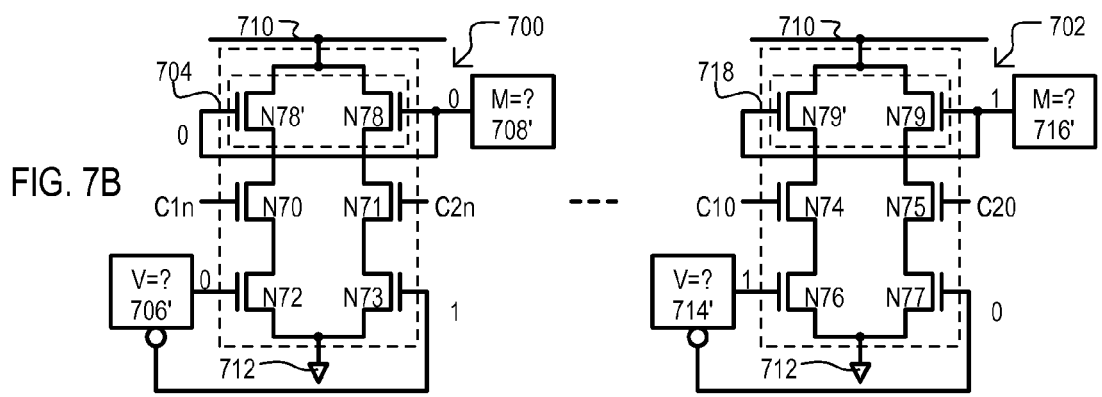

Referring now to FIGS. 7A and 7B, CAM operations according to a sixth embodiment are shown in a series of schematic diagrams. FIGS. 7A and 7B also show two VM CAM cells 700 and 702. The arrangement of FIGS. 7A and 7B can include some of the same general sections and signals as FIGS. 6A and 6B, thus like sections are referred to by the same reference character but with the first digit being a "7" instead of a "6".

FIGS. 7A and 7B can differ from that of FIGS. 6A and 6B in that CAM cells (700 and 702) can include a compare circuit (704/718) in which a first mask transistor N78/N79 has a source-drain path connected between match node 710 and a drain of transistor N71/N75, while a second mask transistor N78'/N79' has a source-drain path connected between match node 710 and a drain of transistor N70/74. M stores 708'/716' can output a stored mask value to gates of both corresponding mask transistors N78/78' or N79/79'.

Otherwise, operations can occur in the same general fashion as FIGS. 6A and 6B. Prior to a preset operation, CAM cells (e.g., 700 and 702) can store values not guaranteed to be optimized for low current. After a preset operation, a majority of such CAM cells (represented by CAM cell 700) can store low current data values (e.g., V=M=0). At the same time, a small minority of the CAM cells (represented by CAM cell 702) can be placed into a state to ensure a mis-match indication can still be generated.

In this way, most VM CAM cells of a ternary CAM entry can store data values optimized to reduce current leakage, while one, or a small number of CAM cells can store a data value that enables a mis-match indication to be generated for the entry.

The embodiments described above in FIGS. 4A to 7B have shown embodiments in which stored data values can directly control an impedance path included in a match indication path. That is, current flowing from a match node to a reference node can pass through one or more transistors controlled by stored data values. Other CAM cell configurations can include arrangements in which a current flow to/from a match node can be indirectly controlled by stored data values. Particular examples of such arrangements will now be described.

Figure 8A:
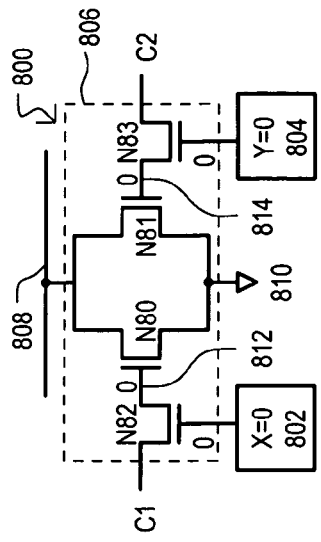
FIGS. 8A to 8C are block schematic diagrams showing a preset operation for a third type XY CAM cell according to an embodiment.
Figure 8B:
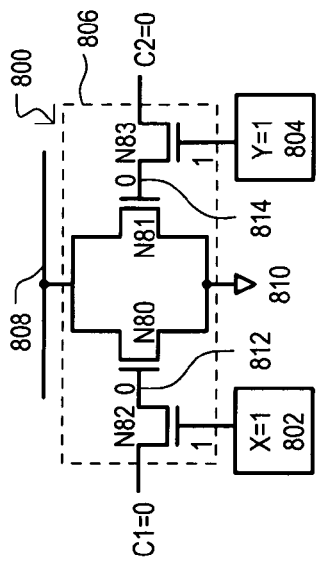
Figure 8C:
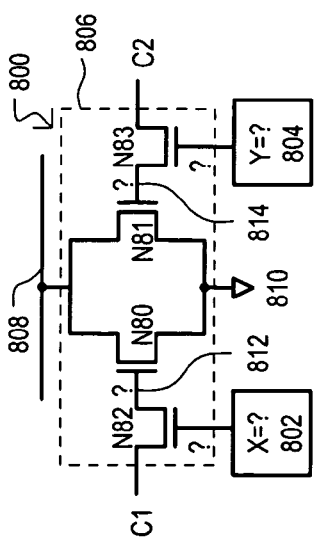

Referring now to FIGS. 8A to 8C, CAM cell operations according to a seventh embodiment are shown in a series of schematic diagrams. FIGS. 8A to 8C show a XY CAM cell 800 that can include a first storage circuit (X store) 802, a second storage circuit (Y store) 804, and a compare circuit 806. A compare circuit 806 can include match path transistors N80 and N81 having source-drain paths arranged in parallel between a match line 808 and a reference node 810, and a first data controlled transistor N82 having a source-drain path connected to a gate of transistor N80, and a second data controlled transistor N83 having a source-drain path connected to a gate of transistor N81. In the very particular example of FIGS. 8A to 8C, transistors N80 to N83 can be n-channel IGFETs.

Transistor N82 can receive a first compare value C1 at its source, while transistor N83 can receive a second compare value C2 at its source. As in previous embodiments, compare values C1/C2 can vary according to operation. For example, in a compare operation such values can be complementary values for a bit of a comparand, and in a non-compare operation can both be driven to a potential that can place their respective transistors (N80/N81) in as high an impedance state as possible (e.g., C1=C2=logic "0").

In the particular example of FIGS. 8A to 8C, a node formed by the connection of a drain of transistor N82 to a gate of transistor N80 can be considered a first control node 812, as it controls transistor N80. Similarly, a node formed by the connection of a drain of transistor N83 to a gate of transistor N81 can be considered a second control node 814.

CAM cell 800 can represent a majority of CAM cells for an entry that does not store valid data.

FIG. 8A shows states of CAM cell 800 prior to a two step preset operation. X store 802 and Y store 804 can store values that are indeterminate, or otherwise not guaranteed to be optimal for low current leakage. Accordingly, values stored and output are shown by "?". In the very particular example of FIG. 8A, if a value output from X store 802 or Y store 804 is a logic high, a CAM cell will not store low current leakage values.

FIG. 8B shows states of CAM cell 800 in response to a first step of a two step preset operation. Values can be written into X and Y stores (802 and 804) that place corresponding data controlled transistors N82/N83 into low impedance states (in this particular example, X=Y=1). Concurrently, or subsequently, both compare data values can be driven to values that place corresponding match path transistors N80/N81 into high impedance states (in this particular example, C1=C2=0).

In this way, control nodes 812 and 814 can be preset create a high impedance between match node 808 and reference node 810.

FIG. 8C shows states of CAM cell 800 in response to a second step of a two step preset operation. While compare data values C1/C2 remain at their previous states, new values can be written into X and Y stores (802 and 804) that place corresponding data controlled transistors N82/N83 into high impedance states (in this particular example, X=Y=0).

As noted above, CAM cell 800 can represent a majority of CAM cells of an entry containing invalid data. However, it is understood that a minority of CAM cells, preferably no more than two, can store values that enable a mis-match operation. In the particular example of FIGS. 8A to 8C, such values can be X=1, Y=0, or X=0, Y=1, or preferably X=Y=1.

Figure 9A:
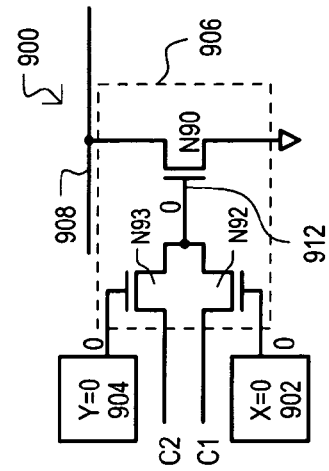
FIGS. 9A to 9C are block schematic diagrams showing a preset operation for a fourth type XY CAM cell according to an embodiment.
Figure 9B:
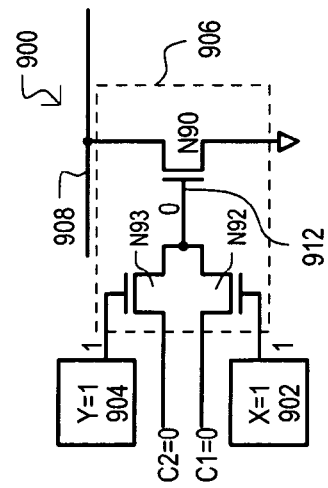
Figure 9C:
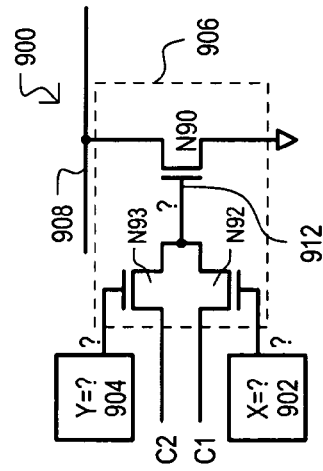

Referring now to FIGS. 9A to 9C, CAM cell operations according to an eighth embodiment are shown in a series of schematic diagrams. The arrangement of FIGS. 9A to 9C can include some of the same general sections and signals as FIGS. 8A to 8C, thus, like sections are referred to by the same reference character but with the first digit being a "9" instead of an "8".

FIGS. 9A to 9C can differ from that of FIGS. 8A to 8C in that XY CAM cell 900 can include a compare circuit 906 having one match path transistor N90 having a source-drain path between a match node 908 and a reference node 910. Further, drains of data controlled transistors N92/N93 are commonly connected to a gate of transistor N90. Thus, a compare circuit 906 includes a single control node 912.

Otherwise, operations can occur in the same general fashion as FIGS. 8A to 8C. Prior to a preset operation, a CAM cell 900 can store values not guaranteed to be optimized for low current. After a first step of a two-step preset operation, control node 912 can be placed to a potential that places match path transistor N90 into a high impedance state. After a second step, a majority of such CAM cells (represented by CAM cell 900) can store low current data values (e.g., X=Y=0). At the same time, a small minority of the CAM cells store data values that can ensure a mis-match indication can still be generated.

In this way, XY CAM cells having discharge paths indirectly controlled by data values, can store data values optimized to reduce current leakage, while one, or a small number of CAM cells can store a data value that enables a mis-match indication to be generated for the entry.

Referring now to FIGS. 10A to 10C, a CAM operations according to a ninth embodiment are shown in a series of schematic diagrams. FIGS. 10A to 10C show a CAM cell 1000 subject to a two step preset operation. The arrangement of FIGS. 10A to 10C can include some of the same general sections and signals as FIGS. 8A to 8C, thus, like sections are referred to by the same reference character but with the first digits being a "10" instead of an "8".

FIGS. 10A to 10C can differ from that of FIGS. 8A to 8C in that a CAM cell 1000 can be VM type CAM cell. Thus, a first storage circuit (V store) 1002 can store a value, and output complementary forms of a stored value. A second storage circuit (M store) 1004 can store a mask value M.

Compare circuit 1006 for CAM cell 1000 can also be different. A data value stored in V store 1002 can be output to a gate of transistor N102, and the complement of such a stored value can be output to a gate of transistor N103. Further, a masking circuit 1007 can be included between drains of transistors N100 and N101 and match node 1008. A masking circuit 1007 can provide a high or low impedance path according to a value provided by M store 1004. For example, a mask circuit 1007 can take the form of transistor N68 shown in FIGS. 6A and 6B, or transistors N78/78' shown in FIGS. 7A and 7B.

Operations for the embodiment of FIGS. 10A to 10C can occur in a similar general fashion as FIGS. 8A to 8C. As shown in FIG. 10A, prior to a preset operation, a CAM cell 1000 can store values not guaranteed to be optimized for low current.

As shown in FIG. 10B, after a first step of a two-step preset operation, control node 1012 can be at a potential that places match path transistor N100 into a high impedance state.

As shown in FIG. 10C, after a second step, a majority of CAM cells (represented by CAM cell 1000) can store data value configured for low current consumption. In the particular case of FIG. 10B, this can include V=M=0. At the same time, a small minority of CAM cells can be placed into a state to ensure a mis-match indication can still be generated. In the particular example shown, this includes V=M=1. However, alternate arrangements could vary a value V.

In this way, VM CAM cells having discharge paths indirectly controlled by data values, can store data values optimized to reduce current leakage, while one, or a small number of such CAM cells can store a data value that enables a mis-match indication to be generated for the entry.

The embodiments of FIGS. 8A to 10C have shown CAM cells that can be placed into a low current state with two data writing operations. Other embodiments can include built-in circuitry for setting control nodes to a desired potential, and thus can place a CAM cell into a low current state with but one write operation. Such approaches will now be described.

Referring now to FIGS. 11A and 11B, a CAM cell having a built-in node setting capability is shown in a schematic diagram and designated by the general reference character 1100. CAM cell 1100 can include the same components as that shown in FIGS. 8A to 8C, thus like components are referred to by the same reference character but with the first digit being an "11" instead of an "8".

Unlike the arrangement of FIGS. 8A to 8C, the embodiment of FIGS. 11A and 11B can include a compare circuit 1106 with node setting devices N115 and N117 coupled to control nodes 1112 and 1114, respectively. In response to a control signal DIS, node setting devices (N115 and N117) can set control nodes (1112 and 1114) to a potential that places match path transistors N110 and N111 into high impedance states. In the particular example of FIGS. 11A and 11B, node setting devices can be n-channel IGFETs having source-drain paths connected between respective control nodes (1112 and 1114) and reference node 1110. Control terminals (in this case the gates) of node setting devices N115 and N117 can receive a node set signal DIS that can transition high to place node setting device N115 and N117 into a low impedance state.

The arrangement of FIGS. 11A and 11B can include a two-step preset operation, but can include one write operation.

FIG. 11A shows a same general step as that show in FIG. 8C. Data values can be written into X and Y stores (1102 and 1104) that place corresponding data controlled transistors N112/N113 into high impedance states (in this particular example, X=Y=0).

FIG. 11B shows a node-setting step that can include activating a node set signal DIS, to place match path transistors N115 and N117 into a high impedance state. Following such a step, control nodes (1112 and 1114) can be set to potentials that place match path transistors N110 and N111 into high impedance states (low, this case), while the logic value stored in X and Y stores (1102 and 1104), ensure such nodes remain isolated.

FIGS. 11A and 11B can represent operations performed on a majority of CAM cells for an invalid entry. As in the case of other embodiments described above, a small minority of CAM cells of the same entry can be placed into a state to ensure a mis-match indication can still be generated. In the particular example shown, this can include programming values X=1, Y=0, or X=0, Y=1, or more preferably, X=Y=1.

It is understood that in arrangements in which compare data values C1/C2 can both be driven low, the steps shown in FIGS. 11A and 11B need not be performed in any particular order. In arrangements in which compare data values C1/C2 cannot be guaranteed to both be driven low, a data writing step (e.g., FIG. 11A) is preferably performed prior to a node setting step (e.g., FIG. 11B).

The same general approach shown in FIGS. 11A and 11B can be implemented in other CAM cell arrangements having match path devices that are not directly controlled according to a stored data value.

As but a first example, such an approach can be implemented for CAM cells like those shown in FIGS. 9A to 9C by including a node setting device that can set control node 912 to a potential that places match path transistor N90 into a high impedance. Preferably, this can include placing an n-channel IGFET with a source-drain path coupled between control node 912 and reference node 910, and a gate that receives a node setting signal (e.g., DIS of FIGS. 11A and 11B).

As but a second example, the approach of FIGS. 11A and 11B can be implemented with CAM cells like that shown in FIGS. 10A to 10C. A node setting devices can be situated between control nodes 1012/1014 and reference node 1010 to that can place match path transistors N100 and N101 into high impedance states. Even more particularly, n-channel IGFETs can be included with a source-drain path coupled between control nodes 1012/1014 and reference node 1010, having a gates that can receive a node setting signal (e.g., DIS of FIGS. 11A and 11B).

In this way, CAM cells with match path impedances not directly controlled by data values can have such impedances preset to a high condition by a node setting signal, as opposed to a write operation in combination with a compare data driving operation.

The embodiments described herein can include storage circuits for storing various values of a CAM cell (e.g., X value, Y value, V value, inverse value N, M value). Possible examples of such storage circuits will now be described.

Referring now to FIG. 12, a storage circuit according to a first embodiment is shown in a schematic diagram and designated by the general reference character 1200. A storage circuit 1200 can include a bistable latch 1202 that can provide complementary data values (D, /D) at a first data node 1204 and a second data node 1206. A bistable latch 1202 can be read from or written to by way of one or more access paths. The very particular example of FIG. 12 shows a bistable latch 1202 formed by cross-coupled complementary metal-oxide-semiconductor (CMOS, though not intended to imply any particular type of gate dielectric) inverters, one formed by p-channel transistor P120 and n-channel transistor N120, the other formed by p-channel transistor P121 and n-channel transistor N121.

A storage circuit like that of FIG. 12, can have a single-ended or differential configuration. In a single-ended configuration, an access device can be provided to one of first or second data node (1204 or 1206). In a differential configuration, two access devices can be provided, one for each of first and second data node (1204 or 1206). Thus, in one arrangement, storage circuit 1200 can include an access n-channel IGFET N122 with a source-drain path connected between first data node 1204 and a bit line 1208. In a differential configuration, storage circuit 1200 can additionally include a second access n-channel IGFET N123, with a source-drain path connected between second data node 1206 and a second bit line 1210.

A storage circuit 1200, as but a few examples, can provide X and/or Y values for an XY type ternary CAM cell, or can provide a mask value M in a VM type ternary CAM cell, or can provide complementary values V and N in VM type ternary CAM cell, or a binary CAM cell.

FIG. 12 shows an example of a storage circuit sometimes referred to as a "static" random access memory (SRAM) type cell. Alternate embodiments include different types of storage circuits, including dynamic RAM (DRAM) type cells. One possible example is shown below in FIG. 13.

Referring now to FIG. 13, a storage circuit according to another embodiment is shown in a schematic diagram and designated by the general reference character 1300. A storage circuit 1300 can include a capacitive storage device that can be charged and discharged via an access device. In the very particular example shown, storage circuit 1300 includes a storage capacitor C130 and an access n-channel IGFET N130. Storage capacitor C130 can have terminals connected between a reference node 1302 and a data node 1304. Transistor N130 can have a source-drain path connected between data node 1304 and a bit line 1306.

A storage circuit 1300, as but a few examples, can provide X and/or Y values for an XY type ternary CAM cell, or can provide a mask value M in a VM type ternary CAM cell, or can provide one of complementary values V and N in VM type ternary CAM cell or a binary CAM cell.

Of course, the examples of FIGS. 12 and 13 are but examples of possible storage cells.

For some embodiments described above, a writing of particular data values can place but one of two possible impedance paths into high impedance states. In particular, for VM type CAM cells, and binary CAM cells, a storage circuit outputs complementary values (V and N). In some embodiments, a CAM cell storage circuit can be modified to have two operational states, one for an entry storing valid data, and another for an entry storing invalid data. Thus, for an entry containing invalid data, a storage circuit storing a single bit value can place two impedance paths into high impedance states. An example of such an arrangement is shown in FIGS. 14A to 17.

Referring now to FIGS. 14A to 14C a CAM cell according to an alternate embodiment is shown in a series of block schematic diagrams, and designate by the general reference character 1400. A CAM cell 1400 can be a binary CAM cell that includes a compare circuit 1402 and a modified storage circuit (modified V store) 1404. A compare circuit 1402 can include transistors N140 and N142 having source-drain paths arranged in series between a match line 1406 and a reference node 1408, and transistors N141 and N144 having source-drain paths arranged in series between match line 1406 and a reference node 1408. In the very particular example of FIGS. 14A and 14B, transistors N140 to N144 can be n-channel IGFETs.

Modified V store 1404 can output a first value V1 to a gate of transistor N143 and output a second value V2 to a gate of transistor N142. Unlike a conventional binary CAM cell arrangement, modified V store 1404 can output values V1/V2 that vary according to mode. For entries containing valid data, modified V store 1404 can output complementary values (i.e., V2=/V1), thus one of transistors N140 or N143 can be in a low impedance state. However, in response to a predetermined signal PRESET, modified V store can output 1404 the same value (i.e., V1=V2). As a result, a CAM cell 1400 can be configured to place both of transistors N140 and N144 into high impedance states. One approach to doing so is shown in FIGS. 14A to 14C.

FIG. 14A shows a state of CAM cell 1400 prior to a preset operation. Modified V store 1404 can store values that are indeterminate, otherwise not guaranteed to store data values optimal for low current leakage. In addition or alternatively, modified V store 1404 can output values that are complementary (e.g., V2=N1). Accordingly, values stored and output are shown by "?".

FIG. 14B shows CAM cell 1400 following a first step of a two-step modified preset operation. Such a step can include writing a predetermined logic value in modified V store 1404. In this case, such a step can include writing a logic 0. Following such a step, modified V store 1404 may place transistor N142 into a high impedance state as value V1=0. However, because value V2=/V1=1, transistor N144 can be in a low impedance state.

FIG. 14C shows CAM cell 1400 following a second step of a two-step modified preset operation. According to a preset signal PRESET, modified V store 1404 can output like logic values, rather than complementary values. As a result, values V1 and V2 are both logic zeros, and both transistors N142 and N144 can be placed into high impedance states.

As in the case of the above embodiments, the CAM cell operation shown in FIGS. 14A to 14C can be applied to a majority of CAM cells for an entry containing invalid data. A minority of CAM cells of such an entry can be configured into a state that can ensure a mis-match, rather a match. In such minority CAM cells, a modified V store 1404 can output complementary values, or can be a conventional storage circuit, that only outputs complementary values.

FIGS. 15A to 15C can differ from that of FIGS. 14A to 14C in that a compare circuit 1502 does not include transistors N140/N141 controlled according to compare data values C1/C2. Instead, compare data value C1 can be received at a source of transistor N152, and compare data value C2 can be received at a source of transistor N154. Otherwise, operations can follow the same steps and FIGS. 14A to 14C.

FIGS. 15A to 15C can differ from that of FIGS. 14A to 14C in that a compare circuit 1502 does not include transistors N140/N142 controlled according to compare data values C1/C2. Instead, compare data value C1 can be received at a source of transistor N152, and compare data value C2 can be received at a source of transistor N153. Otherwise, operations can follow the same steps and FIGS. 14A to 14C.

Figure 16:
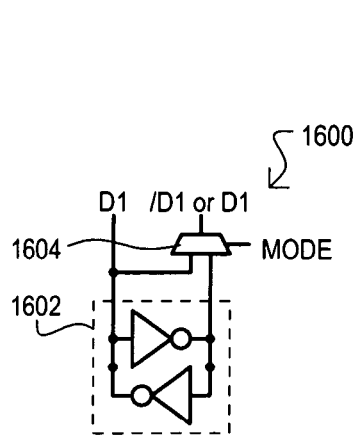
FIG. 16 is a block schematic diagram of a specialized storage circuit that can be included in embodiments like that of FIGS. 14A to 15C.

Referring now to FIG. 16, one example of a possible modified storage circuit, like those shown in FIGS. 14A to 15C, is shown in a block schematic diagram, and designated by the general reference character 1600. A storage circuit 1600 can include a store 1602 and multiplexing (MUXing) circuit 1604. A store 1602 can store a data value, D1, and output such a data value in complementary form D1 or /D1. A MUXing circuit 1604 can receive both forms of a stored data value (D1 and /D1) and can output either according to a mode signal MODE. A signal MODE can be a signal PRESET of FIGS. 14A to 15C, for example.

Figure 17:
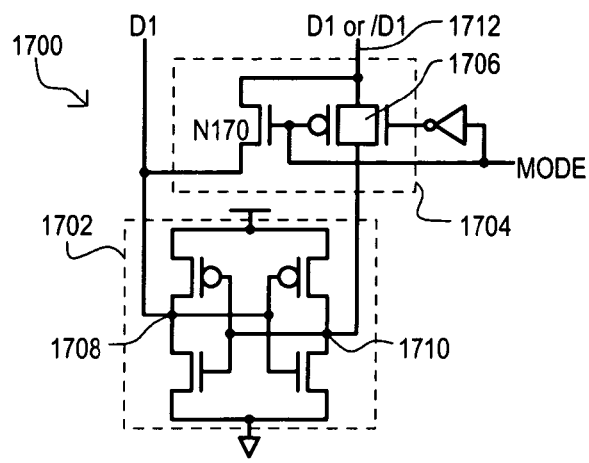
FIG. 17 is a schematic diagram of another specialized storage circuit that can be included in embodiments like that of FIGS. 14A to 15C.

Referring now to FIG. 17, another example of a possible modified storage circuit, like those shown in FIGS. 14A to 15C, is shown in a block schematic diagram, and designated by the general reference character 1700. FIG. 17 shows the same general circuit sections as FIG. 16, thus like sections are labeled with the same reference character but with the first two digits being a "17" instead of "16".

In the very particular example of FIG. 17, a store 1702 can be a bistable latch formed by cross-coupled CMOS inverters. A MUXing circuit can include a first path formed with an n-channel IGFET N170 and a second data path formed by a CMOS passgate 1706. Transistor N170 can have a source-drain path between a first data node 1708 and an output node 1712, and gate that receives signal MODE. Pass-gate 1706 can include n-channel and p-channel devices having source-drain paths connected between a second data node 1708 and output node 1712. A gate the p-channel device of passgate 1706 can receive mode signal MODE, a gate of the n-channel device of passgate 1706 can receive an inverse of signal MODE (/MODE).

It is noted that modified V store circuit can also be included VM type ternary CAM cells. For example, such a storage can be included into embodiments like those shown in FIGS. 6A and 6B, or 7A and 7B, or 10A to 10C, for example.

In embodiments described above, CAM cells can be written to store data values considered optimal for reducing leakage. In particular, for ternary CAM cells it can be desirable to write a same logic value to multiple storage circuits. For example, in the case of a XY type ternary CAM cell, it may be desirable to write values X=Y=0, while in the case of a VM type ternary CAM cell, it may be desirable to write values V=M=0. In some CAM configurations value pairs (X,Y) can be written essentially simultaneously by activating a single word line. A drawback to most XY type ternary cells can be that bit writes to any given cell require writing of both values (X and Y) each time, and do not enable "non-atomic" writes. That is, do not allow for only an X or Y value to be written.

However, in other CAM cell configurations, two separate write operations are needed, one that activates one word line for one value (e.g., V), and another that activates another word line for the other value (e.g., M). A drawback to such an arrangement can be that writes of both values (e.g., M=V=0), require two separate write operations.

Figure 18A:
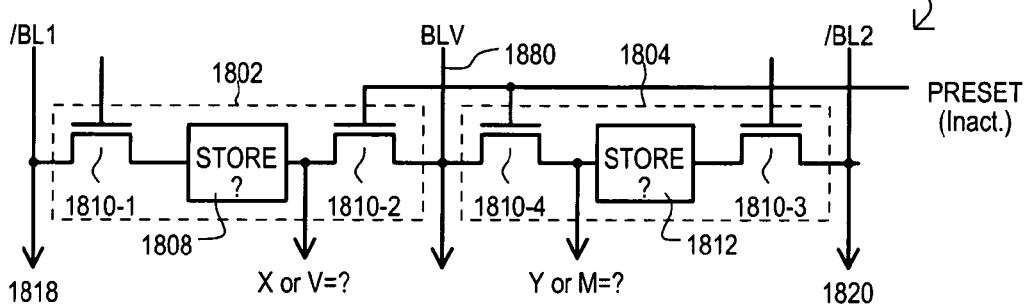
FIGS. 18A and 18B are block schematic diagrams of an XY CAM cell having single bit line simultaneous writing to both X and Y stores that can be included in embodiments of the invention.
Figure 18B:
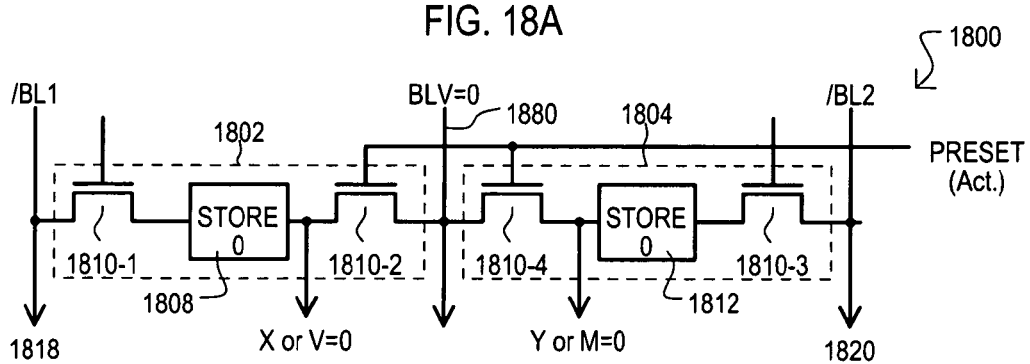

Referring now to FIGS. 18A and 18B, a ternary CAM cell configuration and operation according to another embodiment is shown in a block schematic diagram and designated by the general reference character 1800. A structure like that shown in FIGS. 18A and 18B is disclosed in U.S. patent application Ser. No. 11/438,185 filed on May 22, 2006 by inventors Maheshwari et al., now U.S. Pat. No. 7,570,503, issued on Aug. 4, 2009 The contents of this application are incorporated by reference herein.

A CAM cell 1800 can include a first storage circuit 1802 and a second storage circuit 1804. First storage circuit 1802 can include a first storage section 1808, a first data path 1810-1 and a second data path 1810-2. First and second data paths (1810-18 and 1810-2) can allow data values to be read from and/or written to first storage section 1808. In a similar fashion, second storage circuit 1804 can include a second storage section 1812, a third data path 1810-3 and a fourth data path 1810-4. Third and fourth data paths (1810-3 and 1810-4) can allow data to be read from and/or written to second storage section 1812.

Referring still to FIGS. 18A and 18B, a CAM cell 1800 can be connected to a first bit line 1818, a second bit line 1820, and a shared bit line 1880. Shared bit line 1880 can be connected to both a second data path 1810-1 and a fourth data path 1810-3. Further, in a preset operation, both a second data path 1810-1 and a fourth data path 1810-3 can be enabled by a signal PRESET.

FIG. 18A shows a CAM cell 1800 prior to a preset operation. Storage sections 1808 and 1812 can store values that are indeterminate, or otherwise not guaranteed to store data values optimal for low current leakage.

In a preset operation, first and third data paths (1810-1 and 1810-3) can be in a high impedance state, second and fourth data paths (1810-2 and 1810-4) can be placed into a low impedance state. Further, shared bit line 1880 can be driven to a value that results in first and second storage circuits (1802 and 1804) storing values considered optimal for low current leakage (in this case X=Y=0 or V=M=0).

At the same time, a CAM cell 1800 retains the capability of "non-atomic" writes (i.e., writes of X or Y values individually).

In this way, a ternary CAM cell can accommodate non-atomic write operations with only three non-power supply lines arranged in a column wise direction, while at the same time enabling a preset operation that writes high impedance setting values to both storage circuits of the CAM cell.

Having described CAM cell structures, operations, and configurations, that show CAM cells with storage circuits that output optimal values for a high impedance state, circuits for placing such CAM cells into such states will now be described.

Figure 19A:
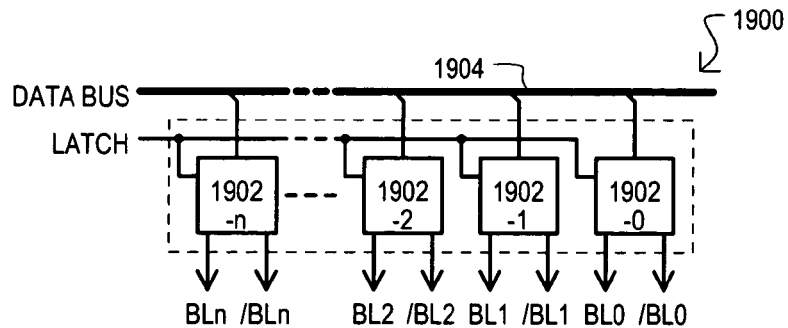
FIG. 19A is a write register that can act as a preset circuit according to an embodiment.
Figure 19B:
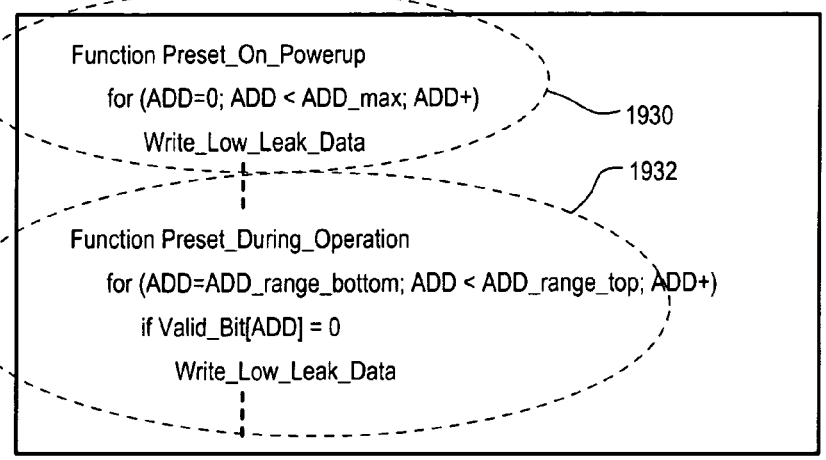
FIGS. 19B and 19C show write operations that can be executed on a CAM device according to an embodiment.
Figure 19C:
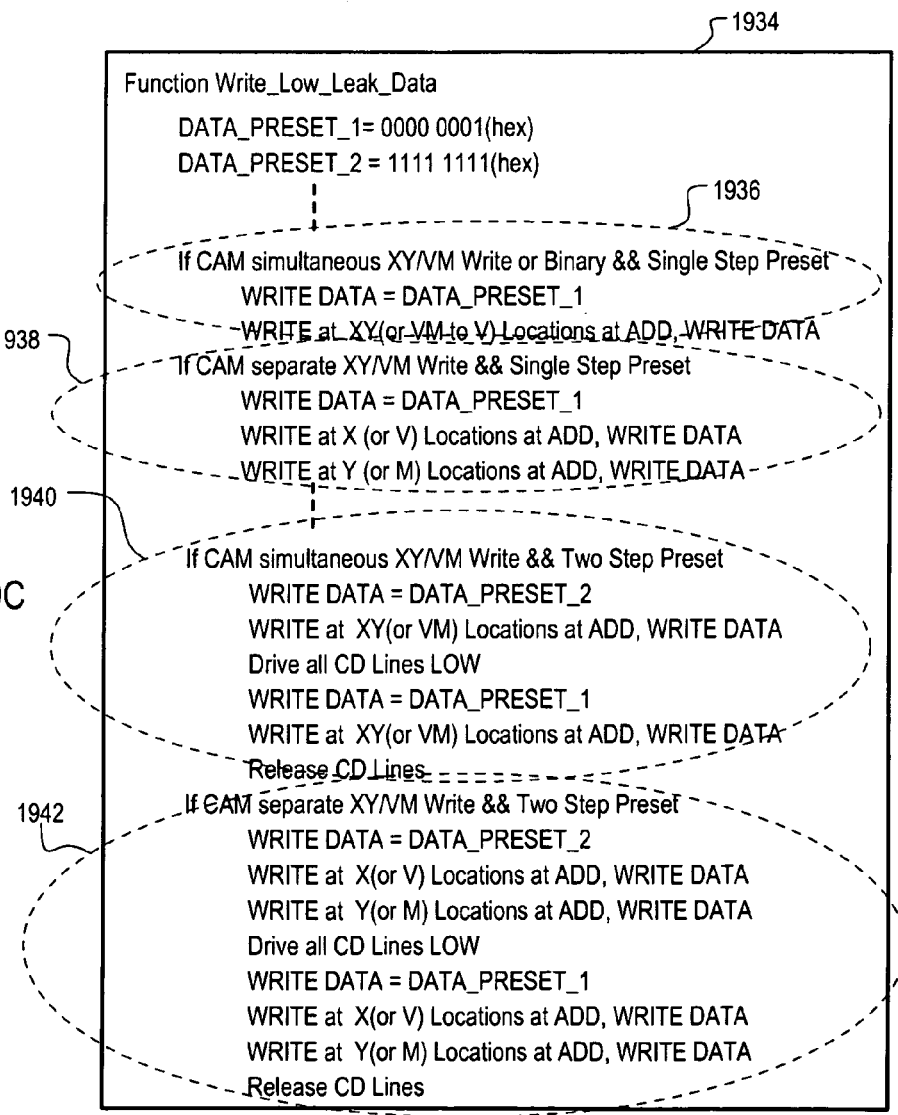

Referring now to FIGS. 19A to 19C, a circuit for a presetting operation for CAM cells will now be described. In the embodiment of FIGS. 19A to 19C it is assumed that writing a data value "0" one or more times to a CAM results in a CAM cell having values considered optimal for low leakage current.

FIG. 19A shows a data register circuit 1900 for a CAM device. A data register circuit 1900 can include a number of write bit registers 1902-0 to 1902-n, each connected to a data bus 1904. In response to a latch signal, bit registers (1902-0 to 1902-n) can latch a write data value. A latched write data value can then be written into CAM cells storage circuits in a conventional fashion.

FIG. 19B shows two possible procedures for preset operations. FIG. 19C shows various examples of data writing operations, according to CAM device type. FIGS. 19B and 19C describe arrangements in "pseudocode," a broad way of expressing the various steps in a method and/or functions of system. The pseudocode may be implemented into particular computer language code versions for use in a system having a general processor or specialized processor. In addition, the described method can be implemented in a higher level hardware designing language, to enable such functions to be realized as an application specific integrated circuit (ASIC) or a portion of an ASIC or a programmable logic device, or portion of a programmable logic device, as but a few examples. Further, the examples of FIGS. 19B and 19C assume 32-bit data values can be written to a CAM. Larger entry sizes would obviously include correspondingly larger write data values, and smaller entry sizes would obviously include smaller write data values.

FIG. 19B illustrates two possible preset functions. A first function 1930 can be executed upon power up of a CAM device. As noted above, for many conventional CAM devices, storage circuits can power-up into unknown states. A function 1930 can include sequentially accessing a range of addresses, and for each address writing data values to storage cells considered optimal for low leakage. Such an action is shown as "Write_Low_Leak_Data". In this way, upon power-up, all locations in a given range can be placed into low leakages states.

The other function shown in FIG. 19B, function 1932, can selectively write low leakage data based upon a state of a given entry. Thus, FIG. 19B can check a valid status of a given address, and if the address is indicated as storing invalid data (Valid_Bit[ADD]=0), low leakage data can be written into the entry.

Of course, FIG. 19B shows but a few of the many possible functions implemented by, or executed on a CAM devices. As but a few examples, an action "Write_Low_Leak_Data" can be executed at an address whenever the status of the data stored by the address is changed from valid to invalid.

FIG. 19C shows various examples of data writing function 1934, like that shown as "Write_Low_Leak_Data" in FIGS. 19A and 19B. Such a write function can utilize different write data values depending upon CAM device configurations. For example, CAM devices that can be placed into a low leakage configuration with a single write operation, such as those shown in FIGS. 4A to 7B and 14A to 15C, can be considered "Single Step Preset" devices. In contrast, CAM devices including match paths that are not directly controlled by stored data values, such as those shown in FIGS. 8A to 10C, can be considered "Two Step Preset" devices.

Referring still to FIG. 19C, as shown by section 1936, if both locations of a ternary CAM device (X and Y, or V and M) can be written with a value simultaneously, or if the CAM device is a binary CAM device, a data writing function 1934 can write a data value that places a majority of CAM cells at the location having address ADD into a high impedance state. In the very particular example of FIG. 19B, such a data value is 0000 0001(hex), which can place all but the CAM cell of least significance into a high impedance state.

Section 1938 shows the same general operation as section 1934, but for a ternary CAM that requires two write operations for each location.

Sections 1940 and 1942 show data writing operation for a two-step preset operations. In such section, a data writing function can write a first data value that places the CAM cells of the entry into states that allow control nodes to be driven by compare data values. In the very particular example of FIG. 19B, such a data value is 1111 1111(hex). Subsequently, all compare data values lines can be driven low. Such an operation can place match path devices into a high impedance state. Next, CAM cells of the entry can be written with data that maintains match paths for the majority of the CAM cells in such a high impedance state. In the very particular example of FIG. 19B, such a data value is 0000 0001(hex). This can maintain the CAM cell(s) of least significance into a low impedance state.

Of course, for functions/operations utilizing two write steps (e.g., separate X, Y writes, separate V, M writes), such values need not be written to the same address sequentially (i.e., a function can write all X (or V) values to all applicable addresses and then write all Y (or M) values to all applicable addresses).

In this way, write circuits of a CAM device can execute a preset operation with data loading and write functions that result in CAM cells storing data values optimal for low leakages states.

While a CAM device can utilize the loading and writing of data values to place CAM cells into states optimized for low leakage, alternate embodiments can include specialized write circuits for executing such operations. Various examples of such approaches will now be described with reference to FIGS. 20 to 22B.

FIG. 20 shows a data register circuit 2000 for a CAM device. Like the arrangement of FIG. 19A, a data register circuit 2000 can include a number of write bit registers 2002-0 to 2002-$n$, each connected to a data bus 2004. However, unlike the arrangement of FIG. 19A, bit registers (2002-0 to 2002-$n$), can be preset to store write data values needed to place CAM cells into a high impedance state. Thus, in response to one or more preset signals, bit registers (2002-0 to 2002-$n$) can store data values for a write operation (e.g., 0000 0001(hex), 1111 1111(hex)). Such values can then be written into entries as needed.

FIG. 21 shows one very particular example of bit registers 2100 according to one very particular embodiment. FIG. 21 shows a first type register 2102-$n$ and a second type register 2102-0. Both type registers (2102-$n$ and 2102-0) can include latches 2104-$n$ and 2104-0 formed by cross-coupled inverters. At least a first storage node of each latch (2104-$n$ and 2104-0) can be connected to a data bus line by a corresponding pass gate (2106-$n$ and 2106-0). A storage node of each latch (2104-$n$ and 2104-0) can be provided as an input to a bit line driver circuit (2108-$n$ and 2108-0). It is understood that while FIG. 21 shows differential bit line drivers (drivers that drive two bit lines), other embodiments can include single-ended bit line drivers.

Bit registers (2104-$n$ and 2104-0) can also include primary preset devices that can force a write register to store a predetermined value (e.g., 0000 0001(hex)). Bit register 2102-$n$, which can correspond to a majority of CAM cells in an entry, can include a first preset device 2110 that can force the register to store a first logic value (e.g., logic "0"). In contrast, bit register 2102-0, which can correspond to a minority of CAM cells for the entry, can include a second preset device 2112 that can force the register to store a second logic value (e.g., logic "1"). In the very particular example of FIG. 21, a first preset device 2110 can be an n-channel IGFET having a source-drain path connected between a first data node of latch 2104-$n$ and a low power supply node, while a second preset device 2112 can be an n-channel IGFET having a source-drain path connected between a second data node of latch 2104-0 and a low power supply node. Both first and second preset device (2110 and 2112) can be activated in response to a first preset signal PRESET1.

Optionally, bit registers 2102-0 and 2102-$n$ can also include secondary preset devices to force a write register to store another value that can be used in a preset operation (e.g., 1111 1111(hex)). Thus, majority bit register 2102-$n$ and minority bit register can optionally include a third preset device 2114-0/1 that can force such registers to store a second logic value (e.g., logic "1"). Both third preset devices 2114-0/1 can be activated in response to a second preset signal PRESET2.

In this way, a write register can be automatically configured to store write data values needed to establish low leakage states.

In addition or alternatively, a CAM device can utilize bit line drivers configured to drive bit lines to predetermined values used in a preset operation. One possible embodiment is shown in FIGS. 22A and 22B.

Referring now to FIG. 22A, a bit line driving circuit according to one embodiment is shown in a block schematic diagram and designated by the general reference character 2200. A bit line driving circuit 2200 can include bit line drivers that drive bit lines in order to write data into storage circuits of CAM cells. The very particular example of FIG. 22A shows an arrangement in that includes tri-statable complementary bit line driver pairs 2202-n to 2202-0 for each bit value to be written.

FIG. 22A also shows majority preset logic 2204-n and minority preset logic 2204-0. Majority preset logic 2204-n can exist for a majority of written bit values of a data word, preferably all but a few bit values, even more preferably all but two of the written bit values. Minority preset logic 2204-0 can exist for a minority of written bit values of a data word.

Majority preset logic 2204-n can receive a write data bit value Dn and a first preset signal PRST1. Similarly, minority preset logic 2204-0 can receive a write data bit value D0 and a first preset signal PRST1. The operation of preset logic (2204-n and 2204-0) can follow the table shown in FIG. 22B. That is, when signal PRST1 is not active (in this case logic "0"), preset logic (2204-n and 2204-0) operates in a conventional fashion, outputting bit values that enable bit line drivers (2202-n to 2202-0) to drive bit lines according to received write bit values. However, when signal PRST1 is active (in this case logic "1"), majority preset logic 2204-n outputs bit values that enable corresponding bit line drivers 2202-n to drive bit lines with values corresponding to low leakage states in a CAM cell (in this case logic "0"). At the same time, minority preset logic 2204-0 can output a bit value that enables a corresponding bit line driver 2202-n to drive bit lines with a value that enables a CAM cell to generate a mis-match indication (in this case a logic "1").

Optionally, majority and minority preset logic (2204-n to 2204-0) can also receive a second preset signal PRST2. The operation of preset logic (2204-n and 2204-0) in response to signal PRST2 is also shown in FIG. 22B. When signal PRST2 is active and signal PRST1 is not active, preset logic (2204-n and 2204-0) can drive bit lines with values that enable control nodes within compare circuits to be set to high impedance voltages (in this case a logic "1", understood to operate in conjunction with compare data lines being drive low).

In this way, write values can be set without a data load operation, to enable a CAM device can execute a preset operation that results in CAM cells storing data values optimal for low leakages states.

While a CAM device can utilize entry-by-entry writing approaches using generated preset write data values, alternate embodiments can include specialized multiple row access circuits for executing such operations. Various examples of such approaches will now be described with reference to FIGS. 23A and 23B.

Figure 23A:
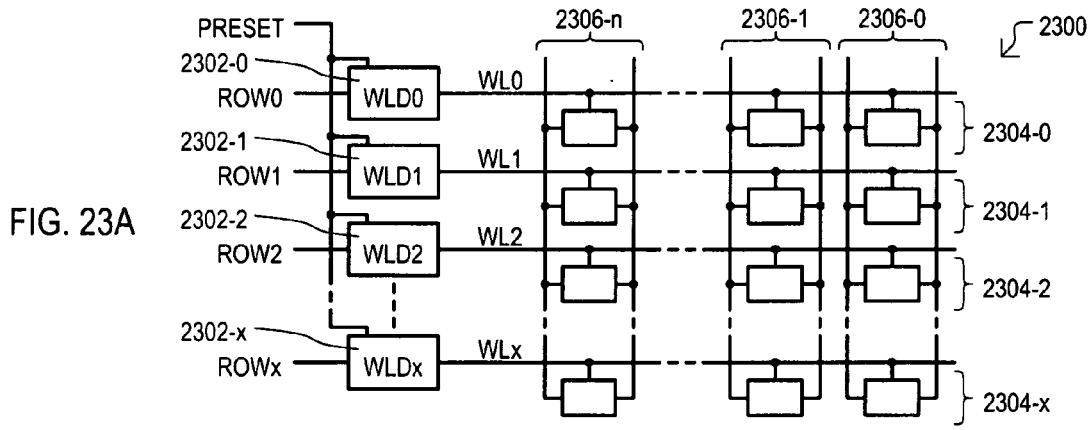
FIGS. 23A and 23B are block schematic diagrams showing specialized word line driver circuits that can be included in embodiments of the invention.

FIG. 23A shows a row driving arrangement according to one embodiment of the present invention in a block schematic diagram and designated by the general reference character 2300. A row driving circuit 2300 can include a number of word line driver circuits 2302-0 to 2302-x that each drives a corresponding word line WL0 to WLx. Each word line (WL0 to WLx) can be connected to storage circuits for an entry 2304-0 to 2304-x. When a word line (WL0 to WLx) is activated, data values on bit lines (2306-0 to 2306-n) can be written into such storage locations.

Each word line driver circuit (2302-0 to 2302-x) can receive a corresponding row select signal (ROW0 to ROWx) as well as a group preset signal PRESET. When signal PRESET is inactive, row driving circuit 2300 can act in a conventional fashion. One of row select signals (ROW0 to ROWx) can be activated by an address decoding operation. In response, a corresponding word line (WL0 to WLx) can be activated to write data to one entry. In contrast, when signal PRESET is active, row driving circuit 2300 can activate multiple word lines (WL0 to WLx) essentially simultaneously. This can allow a same preset value to be written into multiple entries at the same time.

Figure 23B:
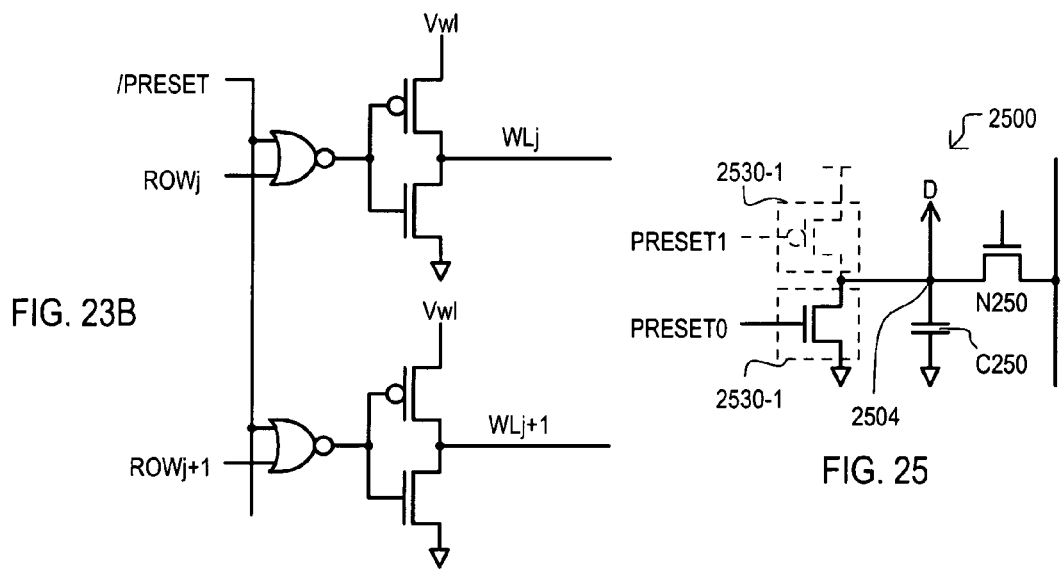

Referring now to FIG. 23B one example of many possible word line driver circuits, like those shown as 2302-0 to 2302-x in FIG. 23A, is shown in a schematic diagram.

In this way, data values can be written to multiple entries at the same time that can result in CAM cells of such entries storing data values optimal for low leakages states.

While circuits for executing a preset operation can include write circuits that access CAM storage circuits by way of bit lines, or the like, a preset circuitry can also exist within storage circuits. Two of many possible CAM cell level preset circuits will now be described with reference to FIGS. 24 and 25.

Figure 24:
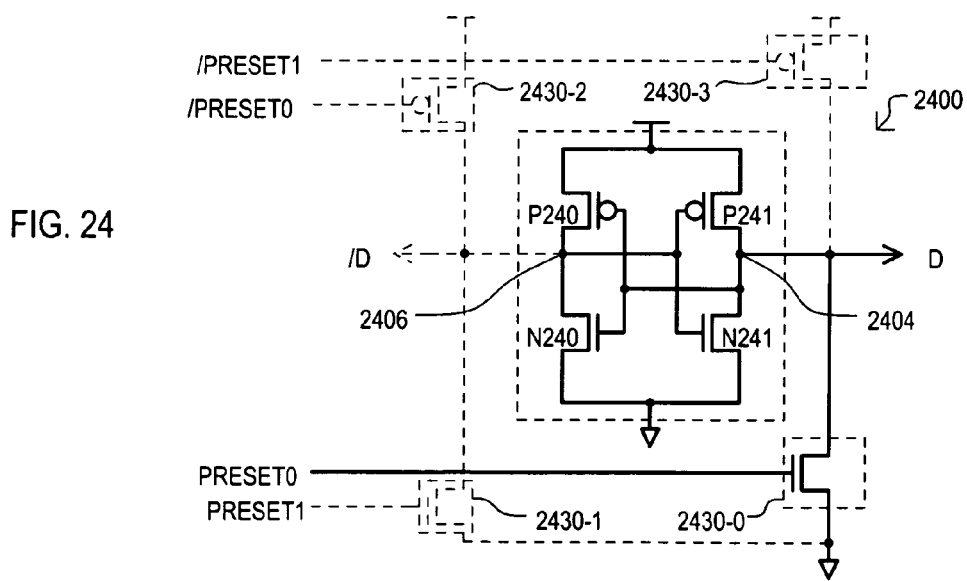
FIG. 24 is a schematic diagram of a CAM cell storage circuit with preset capabilities that can be included in embodiments of the invention.
Figure 30:
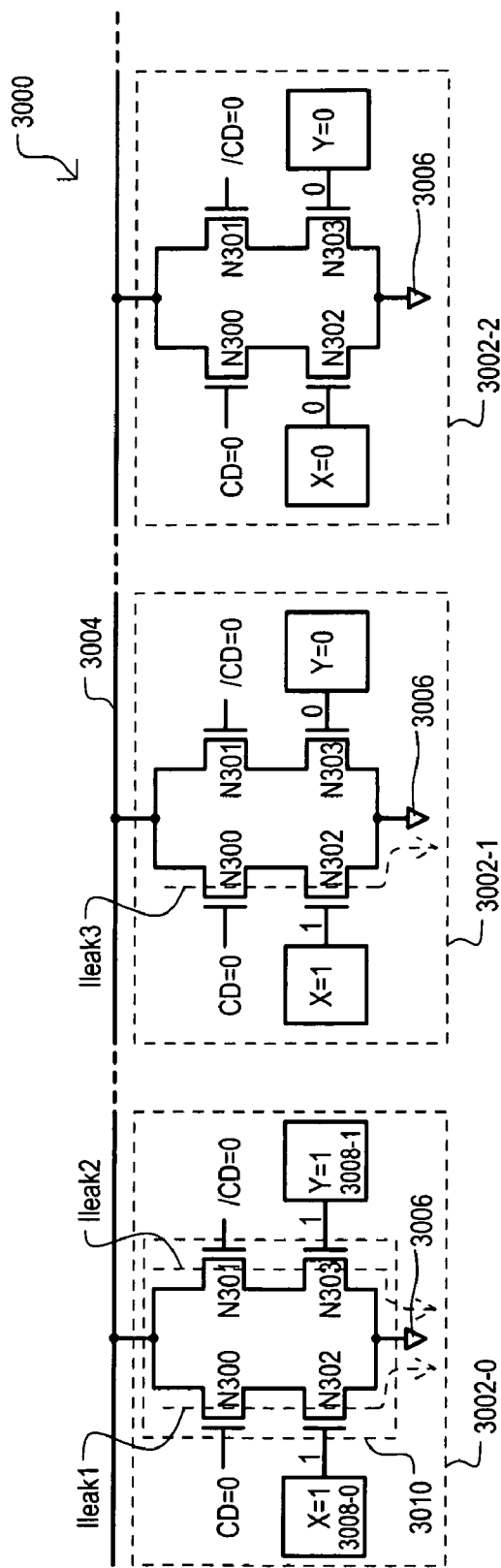
FIG. 30 is a block schematic diagram showing a conventional XY ternary CAM device.

Referring now to FIG. 24 and example of a CAM cell storage circuit with preset capabilities is shown in a schematic diagram and designated by the general reference character 2400. A storage circuit 2400 can include some of the same general items as that shown in FIG. 12, thus like items are referred to by the same reference character but with the first two digits being "24" instead of "12".

Unlike the arrangement of FIG. 12, a storage circuit 2400 can include one or more preset devices that can drive a data node (2404 or 2406) to a predetermined potential, and/or data nodes (2404 and 2406) to opposite potentials. The particular example of FIG. 24 shows a preset device 2430-0 that can drive first data node 2404 to a low power supply node potential. Further, in FIG. 24 preset device 2430-0 can be an n-channel IGFET having a source-drain path connected between first data node 2404 and a low power supply node, and a gate that receives a signal PRESET0. However, alternate embodiments can include other preset devices instead of, or in addition to preset device 2430-0. One alternate preset device 2430-1 can drive second data node 2406 to a low power supply potential to establish a stored data value opposite to that established by preset device 2430-0. Another alternate preset device 2430-2 can drive second data node 2406 to a high power supply potential to establish a stored data value the same as that established by preset device 2430-0. A fourth alternate preset device 2430-3 can drive first data node 2404 to a high power supply potential to establish a stored data value opposite to that established by preset device 2430-0.

Figure 25:
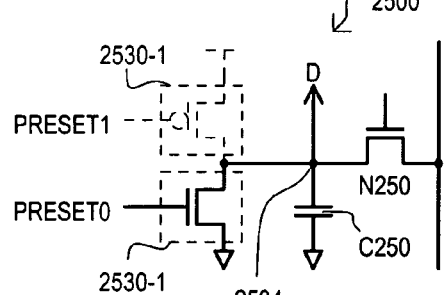
FIG. 25 is a schematic diagram of another CAM cell storage circuit with preset capabilities that can be included in the embodiments.

Referring now to FIG. 25, another example of a CAM cell storage circuit with preset capabilities is shown in a schematic diagram and designated by the general reference character 2500. A storage circuit 2500 can include some of the same general items as that shown in FIG. 13, thus like items are referred to by the same reference character but with the first two digits being "25" instead of "13".

Unlike the arrangement of FIG. 13, a storage circuit 2500 can include one or more preset devices that can drive data node 2504 to a predetermined potential. The particular example of FIG. 25 shows a preset device 2530-0 that can drive data node 2504 to a low power supply node potential. Further, in FIG. 24 preset device 2530-0 can be an n-channel IGFET having a source-drain path connected between data node 2504 and a low power supply node, and a gate that receives a signal PRESET0. However, alternate embodiments can include other preset devices instead of, or in addition to preset device 2530-0. One alternate preset device 2530-1 can drive data node 2504 to a high power supply potential to establish a stored data value opposite to that established by preset device 2530-0.

In this way, storage circuits of CAM cells can be automatically triggered to store data value consistent with low leakage.

While CAM cell storage circuits can be forced to store predetermined values in response to signal, in other embodiments CAM cell storage circuits may inherently assume predetermined logic storing states in response to an event. For example, CAM cell storage circuits may store predetermined values in response to a power-up operation, without the application of any particular signal to such a storage circuit. Various examples of such approaches will now be described with reference to FIGS. 26 29.

Referring now to FIG. 26, a CAM cell according to another embodiment is shown in a block schematic diagram and designated by the general reference character 2600. A CAM cell 2600 can include a storage circuit 2604 and a compare circuit 2606.

Compare circuit 2606 can be arranged between a match node 2608 and reference node 2610. In a compare operation, a compare circuit 2606 can form a high or low impedance path between its respective match node 2608 and reference node 2610 to thereby indicate a match or mis-match with a compare data value CD. In a non-compare operation, a compare circuit 2606 can have a leakage current Ileak. The value of a leakage current (Ileak) can vary according to data value output from storage circuit 2604. Thus, as in the various embodiments described above, there can be an optimal data value for storage circuit 2604 for minimizing leakage current each compare circuit 2606.

A storage circuit 2604 can include one or more asymmetric latches that will store a predetermined value in response to a power-up operation. Thus, when power is first applied to a CAM device, the majority of CAM cells in an entry can automatically store data values optimal for low leakage. A minority of such CAM cells can automatically store data values that can enable a mis-match for the entry.

Referring now to FIG. 27, one example of an asymmetric latch is shown in a schematic diagram and designated by the general reference character 2700. An asymmetric latch can include cross-coupled inverters, INV1 and INV2, where one inverter has a different inverter threshold than the other (INVth1≠INVth2). As opposing storage nodes 2702 and 2704 rise in potential, the charging/discharging of one inverter will dominate one storage node, and the latch 2700 will latch into a predetermined state.

Referring now to FIG. 28A, one very particular example of an asymmetric latch is shown in a schematic diagram and designated by the general reference character 2800. Latch 2800 can include some of the same general components as that shown in FIG. 12, thus like components are shown by the same reference character but with the first digits being "28" instead of "12".

FIG. 28A can differ from that of FIG. 12 in that threshold voltage mismatches can be used to weight latch 2800 to power-up in one particular state. As but a few examples a threshold voltage (Vtp) of device P280 may differ from that of P281 and/or a threshold voltage (Vtn) of device N280 can differ from that of N281.

Various approaches can be utilized to establish different threshold voltages. One of the many possible examples is shown in FIGS. 28B. FIG. 28B shows a threshold implant step that can be applied to one transistor, while the other transistor of the same conductivity type is masked. For example, transistor P281 can be subject to a threshold implant step that increases a threshold voltage, while transistor P280 can be masked from such an implant step. As a result, in a power-up operation data node 2806 can be driven high sooner than node 2808, and a latch 2800 can power-up into a D=0,/D=1 state. In addition or alternatively, transistor N280 can be subject to a threshold increasing implant step, while transistor N281 can be masked from such an implant step. As a result, data node 2808 can be driven low sooner than node 2806, and a latch 2800 can power-up into the D=0,/D=1 state.

As another example of altering threshold voltages, a "body" of one transistor (e.g., P281 and/or N280) can be driven to greater bias voltage than a corresponding transistor of the same conductivity type (e.g., P280 and/or N281). Such a bias voltage difference can generate a threshold voltage mismatch, as noted above. As but one very particular example, a body of one p-channel device (e.g., P281) could ramp up toward a high power supply voltage at a faster rate than the other (e.g., P280) and/or be driven to a level higher than a high power supply voltage. In addition or alternatively, a body of one n-channel device (e.g., N280) could ramp down to a low power supply voltage at a faster rate than the other (e.g., N281) and/or be driven to a level below a low power supply voltage.

In this way, threshold voltage differences in a bi-stable latch(es) can be utilized to case such a latch(es) to power-up into a predetermined state(s). The predetermined states can be those states that maintain a compare path in a high impedance state.

It is noted other methods can be used to establish asymmetry in a storage circuit of a CAM cell. For example, drive capabilities (or "on resistance") mismatch between devices can be utilized. As but one example, referring back to FIG. 28A, transistors can be sized differently with a width-to-length ratio (W/L) of transistor P280 being greater than that of transistor P281. In addition or alternatively, a W/L ratio of transistor N281 can be greater than that of N280.

Referring now to FIG. 29, yet another example of an asymmetric latch that can be included in a CAM cell is shown in a schematic diagram and designated by the general reference character 2900.

Latch 2900 can include some of the same general components as that shown in FIG. 12, thus like components are shown by the same reference character but with the first digits being "29" instead of "12".

FIG. 29 can differ from that of FIG. 12 in that it can include a capacitance mismatch between one data node (e.g., 2906) and one power supply node (e.g., 2950) and the other data node (e.g., 2908) and the other power supply node (e.g., 2952). As but a few of the many examples, such a mismatch can include introducing a capacitor C290, while excluding capacitor C291, or making capacitor C291 smaller than C290, or vice versa. It is understood that such a difference in capacitance can be accomplished with capacitor structures separate from transistor devices latch 2900, or utilizing structures inherent in such devices. When one capacitance is greater than the other (e.g., C290>C291) a latch can power-up into one predetermined state (D=0, /D=1). Conversely, capacitance differences have the opposite relationship (e.g., C290<C291) a latch can power-up into the other predetermined state (D=1, /D=0).

In this way, a CAM device can include entries with storage circuits that can power-up into predetermined states. Such predetermined states can place a majority of CAM cells in the entry into low leakage states, while a minority of the CAM cells can enable mis-match indications to be generated by the entry.

It is noted that while various embodiments have shown storage circuits based on DRAM and SRAM type memory cells, alternate memory cells could be utilized in CAM cells, including but not limited to electrically erasable and programmable read-only-memories (EEPROMs) including flash EPROMs, as well as other nonvolatile memory devices such as magneto-resistive RAMs, ferroelectric RAMs, and phase change memories, as but a few examples.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method of placing a content addressable memory (CAM) into a low current state, comprising the steps of:
for at least one storage location that does not store valid data for a compare operation and includes a plurality of CAM cells, each CAM cell having at least two data controllable impedance paths arranged in parallel with one another,
(a) configuring the majority of the CAM cells to store data values that maintain the corresponding at least two data controllable impedance paths in high impedance states, and
(b) configuring at least one of the CAM cells to store data values that maintain at least one of the data controllable impedance paths in a low impedance state.

2. The method of claim 1, wherein:
steps (a) and (b) include writing a single multi-bit data value to the at least one storage location.

3. The method of claim 1, wherein:
the number of CAM cells in the at least one storage location is N,
step (a) includes configuring N−1 of the CAM cells; and
step (b) includes configuring one of the CAM cells.

4. The method of claim 1, wherein:
the CAM cells comprise XY type ternary CAM cells that each provide a masking capability based on predetermined X and Y values, and
step (a) includes writing first predetermined values to X and Y storage locations of the majority of CAM cells; and
step (b) includes writing second predetermined values to X and Y storage locations of the at least one CAM cell.

5. The method of claim 1, wherein:
the CAM cells comprise VM type ternary CAM cells the each provide a masking capability based on a stored mask value (M) regardless of a stored data value (V), and
step (a) includes writing a first predetermined data value to a V storage location of the majority of CAM cells; and
step (b) includes writing a second predetermined data value to V storage locations of the at least one CAM cell.

6. The method of claim 5, wherein:
configuring the majority of CAM cells includes writing a first mask value to M storage locations of each such CAM cell; and
configuring at least one of the CAM cells includes writing a second mask value to M storage locations of such CAM cells.

7. The method of claim 1 wherein:
step (a) includes driving bit lines coupled to the majority of the CAM cells to a first predetermined value, in response to a preset control signal;
step (b) includes driving bit lines coupled to the least one of the CAM cells to a second predetermined value, in response to the preset control signal; and
steps (a) and (b) are performed essentially simultaneously.

8. The method of claim 1, wherein:
step (a) includes setting write registers coupled to the majority of the CAM cells to a first predetermined value, in response to a preset control signal; and
step (b) includes setting write registers coupled to the least one of the CAM cells to a second predetermined value, in response to the preset control signal; and
steps (a) and (b) are performed essentially simultaneously.

9. The method of claim 1, wherein:
the at least two data controllable impedance paths comprise a source-drain path of a first transistor and a source-drain path of second transistor arranged in parallel to one another;
step (a) includes, for each of the majority of CAM cells, coupling a first data storage circuit to a gate of the first transistor and coupling a second data storage circuit to a gate of the second transistor.

10. The method of claim 1, wherein:
step (a) includes
writing a first predetermined data value to the majority of CAM cells in a first write operation, and
driving compare data lines coupled to the majority of CAM cells to predetermined compare data values in a node setting operation, and
writing a second predetermined data value to the majority of CAM cells in a second write operation.

11. A content addressable memory (CAM) device, comprising:
a plurality of entries, each for storing a multi-bit data value for comparison with a multi-bit comparand value, each entry having at least an invalid state when the data value stored therein will not yield a valid match result, each entry including a plurality of CAM cells, each CAM including at least one storage circuit coupled to a corresponding controllable impedance path for generating a match indication; and
a preset circuit that configures storage circuits of a majority of CAM cells for at least one entry in the invalid state to store data values that maintain the corresponding controllable impedance paths in a high impedance state, and configures the storage circuit of at least one mismatch CAM cell of the at least one entry to store a data value that maintains the corresponding controllable impedance path in a low impedance state.

12. The CAM device of claim 11, wherein:
each CAM cell comprises a ternary type CAM cell having at least a first storage circuit coupled to control a first controllable impedance path, a second storage circuit, and a second controllable impedance path coupled in parallel with the first controllable impedance path; and
the preset circuit comprises a write circuit that writes data values to the first and second storage circuits of the CAM cells of the at least one entry.

13. The CAM device of claim 12, wherein:
each CAM cell comprises an XY type CAM cell having the second storage circuit coupled to control the second controllable impedance path.

14. The CAM device of claim 13, wherein:
each CAM cell comprises a VM type CAM cell having the second storage circuit coupled to control a third controllable impedance path arranged in series with at least the first controllable impedance path.

15. The CAM device of claim 11, wherein:
each CAM cell comprises a modified binary CAM cell having a storage circuit that outputs a data value to a first controllable impedance path and configurable to output the data value or its complement to a second controllable impedance path coupled in parallel with the first controllable impedance path.

16. The CAM device of claim 11, wherein:
each CAM cell of the majority of CAM cells of the at least one entry includes
a match indication path having an impedance controlled by a match indication path control terminal,
the controllable impedance path is coupled between the at least one storage circuit at the control terminal, and
a setting device that couples the control terminal to a predetermined potential in response to a preset signal.

17. The CAM device of claim 11, wherein:
the storage circuits are selected from the group consisting of at least one bi-stable latch, and at least one dynamic memory cell comprising a storage capacitor and an access device coupled between one terminal of the storage capacitor and a bit line.

18. The CAM device of claim 11, wherein:
each CAM cell of the majority of CAM cells of the at least one entry includes a first storage circuit and second storage circuit coupled to a common bit line by a preset word line, the preset word line being coupled to all of the majority of CAM cells of the at least one entry; and
the preset circuit includes
a bit line driver circuit that drives the common bit lines of the majority of the CAM cells of the at least one entry to a predetermined value, and
a preset word line driver circuit that drives the preset word line to write the predetermined value into both the first and second storage circuits of the majority of CAM cells of the at least one entry.

19. The CAM device of claim 11, wherein:
the preset circuit includes bit line driver circuits that drive bit lines in response to a compare data value in a first mode, and drive bit lines to predetermined value independent of any compare data value in a second mode.

20. The CAM device of claim 11, wherein:
each of the plurality of entries is coupled to a corresponding word line that enables the writing of data into the corresponding entry; and
the preset circuit includes word line driver circuits that activate one word line in response to a received address in a first mode, and activate multiple word lines to enable writing of a same preset data value to multiple entries, essentially simultaneously, in a second mode.

21. The CAM device of claim 11, wherein:
the preset circuit includes the storage circuits of the majority of CAM cells for the at least one entry having asymmetric bi-stable latches that store preset data values in response to a power-up operation in which a power supply is applied to the storage circuits.

22. The CAM cell of claim 21, wherein:
each asymmetric bi-stable latch comprises
a first inverter that includes a first transistor of a first conductivity type having a source-drain path coupled in series with a second transistor of a second conductivity type, and
a second inverter that includes a third transistor of the first conductivity type having a source-drain path coupled in series with a fourth transistor of the second conductivity type, the gates of the third and fourth transistors being coupled to the drains of the first and second transistors, the gates of the first and second transistors being coupled to the drains of the third and fourth transistors.

23. The CAM device of claim 22, wherein:
each asymmetric bi-stable latch has an asymmetric response induced by any from the group consisting of:
the first transistor having a different threshold voltage than the third transistor,
the second transistor has a different threshold voltage than the fourth transistor,
the first transistor has a different width-to-length ratio (W/L) than the third transistor,
the second transistor has a different W/L than the fourth transistor,
a capacitor coupled between the gates of the first and second transistors and the sources of the first and third transistors,
a capacitor coupled between the gates of the first and second transistors and the drains of the second and fourth transistors,
a first capacitance between the gates of the first and second transistors and the sources of the first and third transistors being different than a second capacitance between the gates of the third and fourth transistors and the drains of the second and fourth transistors.

24. A system for placing unused CAM device entries into a low current state, comprising:
a CAM device data writer that writes a data value into at least one entry that places the majority of CAM cells in the entry into a lowest current drawing state achievable by a written data value, and that places at least one CAM cell of the at least one entry into a low impedance state that forces a mismatch indication for the entry regardless of an applied comparand value, the at least one entry being an entry that does not store valid data for comparison with an applied comparand value.

25. The system of claim 24, wherein:
the system comprises a CAM function that writes data values into each CAM entry upon power-up of the CAM device.

26. The system of claim 25, wherein:
the lowest current drawing state achievable by a written data value is selected from the group consisting of:
for an XY type ternary CAM cell, writing X and Y data values that place transistors controlled according to X and Y data value storage circuits into a high impedance state,
for value (V) and mask (M) type ternary CAM cell, writing an M data value that place any transistors controlled according to an M data value storage circuit into a high impedance state and writing a V data value that places at least one transistor controlled according the V data value into a high impedance state.

27. The system of claim 24, wherein:
the system comprises a CAM function that writes data values into CAM entries indicated to store invalid data that will not generate a valid match indication in a compare operation.

28. The system of claim 24, wherein:
the system comprises a machine readable medium storing instructions for execution by a processor, the instructions including a section that writes a predetermined data value into unused entries of the CAM.

29. The system of claim 28, wherein:
the instructions include writing a first logic value to X and Y storage locations for the majority of CAM cells of the entry, and writing a second logic value to X and Y storage locations of the at least one CAM cell of the entry.

30. The system of claim 28, wherein:
the instructions include writing a first set of logic values to mask (M) and value (V) storage locations for the majority of CAM cells of the entry, and writing a second set of logic values to V and M storage locations of the at least one CAM cell of the entry.

* * * * *